United States Patent [19]
Morinaka et al.

[11] Patent Number: 6,005,422
[45] Date of Patent: Dec. 21, 1999

[54] SEMICONDUCTOR INTEGRATED CIRCUIT AND CONSUMED POWER REDUCING METHOD

[75] Inventors: Hiroyuki Morinaka; Hiroshi Makino; Kimio Ueda; Koichiro Mashiko, all of Tokyo, Japan

[73] Assignee: Mitsubishi Denki Kabushiki Kaisha, Tokyo, Japan

[21] Appl. No.: 08/773,313

[22] Filed: Dec. 24, 1996

[30] Foreign Application Priority Data

May 13, 1996 [JP] Japan ..................... 8-117536

[51] Int. Cl.⁶ .................. H03K 1/04; G06F 1/08
[52] U.S. Cl. .................... 327/141; 327/544; 327/63; 327/199
[58] Field of Search .................... 327/544, 141, 327/199, 50, 63, 64

[56] References Cited

PUBLICATIONS

IEEE 1994 Custom Integrated Circuits Conference, pp. 259–266, 1994, Anantha P. Chandrakasan, et al., "Design of Portable Systems".

*Primary Examiner*—Dinh T. Le
*Attorney, Agent, or Firm*—Oblon, Spivak, McClelland, Maier & Neustadt, P.C.

[57] ABSTRACT

A semiconductor integrated circuit and a method for reducing the consumed power are provided. A comparator outputs bits having the same level, which correspond to each other, of a last input stored in a register and a current input that acts as an input signal. A zero counter counts the number of the bits having the same level output from the comparator. If the number of the bits having the same level is smaller than a predetermined number, the current input is not similar to the last input. Consequently, an instruction is given to a flip-flop to invert the current input. The inverted current input becomes similar to the last input. Thus, the consumed power of a logic can be reduced.

17 Claims, 23 Drawing Sheets

FIG. 21

| NODE 20c OF CONTROL PORTION 20 ON FIRST STAGE | NODE 20c OF CONTROL PORTION 20 ON SECOND STAGE | OUTPUT NODE 20e OF EXCLUSIVE OR IN CIRCUIT 4 |
|---|---|---|
| "L" | "L" | "L" |
| "L" | "H" (INVERT OUTPUT OF LOGIC 15) | "H" |
| "H" (INVERT OUTPUT OF LOGIC 15) | "L" | "H" |
| "H" (INVERT OUTPUT OF LOGIC 15) | "H" (INVERT OUTPUT OF LOGIC 15) | "L" |

FIG. 23A

GENERAL EXPRESSION $$\begin{aligned}A+B+Carry &= (A+B+Carry+1)-1\\ &= \overline{(-A-B-Carry-1)}\\ &= \overline{((-A-1)+(-B-1)+(1-Carry))}\\ &= \overline{(\overline{A}+\overline{B}+\overline{Carry})}\end{aligned}$$

FIG. 23B

EXAMPLE OF CALCULATION

| $A+B+Carry$ | $\overline{(\overline{A}+\overline{B}+\overline{Carry})}$ |
|---|---|
| 11100 (−4)⋯ A<br>00010 (+2)⋯ B<br>+    1 (+1)⋯Carry<br>11111 (−1) | 00011 (+3)⋯ $\overline{A}$<br>11101 (−3)⋯ $\overline{B}$<br>+    0 ( 0 )⋯$\overline{Carry}$<br>00000 ( 0 )<br>↓INVERSION<br>11111 (−1) |

FIG. 26

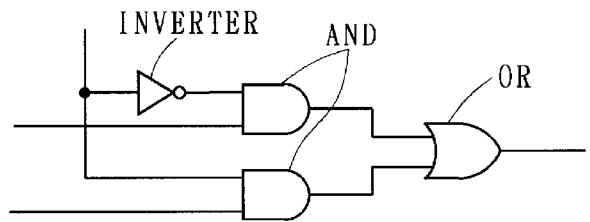

FIG. 27A

GENERAL EXPRESSION $$\overline{A} \times \overline{B} = (-A-1)(-B-1) = A \times B + A + B + 1$$
$$\therefore A \times B = \overline{A} \times \overline{B} - A - B - 1$$
$$= \overline{A} \times \overline{B} + (-A-1) + (-B-1) + 1$$
$$= \overline{A} \times \overline{B} + \overline{A} + \overline{B} + 1$$

FIG. 27B

EXAMPLE OF CALCULATION

| A × B | $\overline{A} \times \overline{B} + \overline{A} + \overline{B} + 1$ |
|---|---|
| 00001001 (+9)···A<br>× 11111011 (−5)···B | 11110110 (−10)··· $\overline{A}$<br>× 00000100 (+4)··· $\overline{B}$ |
| 1001<br>  1001<br>   1001<br>    1001<br>     1001<br>      1001<br>1001 | 1111011000 ··· $\overline{A} \times \overline{B}$<br>↓ INVERSION<br>1111011000 (−40)··· $\overline{\overline{A} \times \overline{B}}$<br>1111110110 (−10)··· $\overline{A}$<br>0000000100 (+4)··· $\overline{B}$<br>+           1 (+1) |
| 111010011 | 1111010011 (+45) | ically to a semiconductor integrated circuit of a clock synchronous
SEMICONDUCTOR INTEGRATED CIRCUIT AND CONSUMED POWER REDUCING METHOD

BACKGROUND OF THE INVENTION

1. Field of the Invention

The present invention relates to a semiconductor integrated circuit and a method for reducing consumed power of the semiconductor integrated circuit, and more particularly to a semiconductor integrated circuit of a clock synchronous system which operates on receipt of a clock signal, and a method for reducing consumed power of the semiconductor integrated circuit.

2. Description of the Background Art

Recently, the consumed power of a semiconductor integrated circuit has been increased. Various attempts have been made to reduce the consumed power. As effective methods for taking the dependency of an input signal into consideration, a method for reducing the consumed power by changing the representation of twos complement to the sign—absolute value representation to perform an operation, a method for reducing the consumed power by changing the order of input signals, and the like have been proposed (IEEE 1994 Custom Integrated Circuits Conference, 12.1.1–12.1–8, pp 259–266).

However, the representation of twos complement is essentially suitable for the signal processing such as an arithmetic operation. For this reason, in the case where the signal processing is performed based on the sign—absolute value representation, not only the design of an operation part but also that of a control circuit for the signal processing becomes complicated. In the case where the order of the input signals is changed, there is a problem that the function of retaining the input signals is required besides the complicated design of the control circuit for the signal processing.

SUMMARY OF THE INVENTION

A first aspect of the present invention is directed to a semiconductor integrated circuit comprising a consumed power reduced portion whose consumed power is to be reduced, a last input storing portion for storing a last input including a plurality of bits to be input to the consumed power reduced portion, an inversion deciding portion, on receipt of the last input stored in the last input storing portion and a current input including a plurality of bits to be input to the consumed power reduced portion after the last input is input to the consumed power reduced portion, for deciding whether each bit of the current input is inverted or not in order to reduce the consumed power of the consumed power reduced portion based on the state of each bit of the current and last inputs, and an inverting portion, on receipt of the current input and the result of decision obtained by the inversion deciding portion, for outputting, to the consumed power reduced portion, the current input as it is or a signal obtained by inverting the current input based on the result of decision.

A second aspect of the present invention is directed to the semiconductor integrated circuit wherein the inversion deciding portion includes a comparing portion for comparing the states of bits, which correspond to each other, of the current and last inputs and for outputting the result of comparison, and a count portion, on receipt of the result of comparison, for deciding whether each bit of the current input is inverted or not depending on whether the number of bits having the same level, which correspond to each other, of the current and last inputs is greater than a preset number or not.

A third aspect of the present invention is directed to the semiconductor integrated circuit wherein the inversion deciding portion includes a combination storing portion for storing, in advance, a first combination of the state of bits of the current input and that of bits of the last input obtained when the current input is inverted, and a second combination of the state of bits of the current input and that of bits of the last input obtained when the current input is not inverted, and decides whether each bit of the current input is inverted or not depending on whether the state of bits of the current input and that of bits of the last input apply to the first or second combination.

A fourth aspect of the present invention is directed to a semiconductor integrated circuit comprising a consumed power reduced portion whose consumed power is to be reduced and which can set all internal nodes to a constant level, an inversion deciding portion for receiving a current input including a plurality of bits to be input to the consumed power reduced portion after the all internal nodes of the consumed power reduced portion are set to the constant level, and for deciding whether each bit of the current input is inverted or not in order to reduce the consumed power of the consumed power reduced portion based on the state of each bit of the current input, and an inverting portion, on receipt of the current input and the result of decision obtained by the inversion deciding portion, for outputting, to the consumed power reduced portion, the current input as it is or a signal obtained by inverting the current input based on the result of decision.

A fifth aspect of the present invention is directed to the semiconductor integrated circuit wherein the inversion deciding portion receives the bits having the same level of the current input and decides whether each bit of the current input is inverted or not depending on whether the number of the bits is greater than a preset number or not.

A sixth aspect of the present invention is directed to the semiconductor integrated circuit wherein the inversion deciding portion includes a combination storing portion for storing, in advance, a first combination of the state of bits of the current input obtained when the current input is inverted, and a second combination of the state of bits of the current input obtained when the current input is not inverted, and decides whether each bit of the current input is inverted or not depending on whether the state of bits of the current input applies to the first or second combination.

A seventh aspect of the present invention is directed to a semiconductor integrated circuit to which at least one of first and second structures is connected in series, the first structure comprising a first consumed power reduced portion whose consumed power is to be reduced, a last input storing portion for storing a last input including a plurality of bits to be input to the first consumed power reduced portion, a first inversion deciding portion, on receipt of the last input stored in the last input storing portion and a first current input including a plurality of bits to be input to the first consumed power reduced portion after the last input is input to the first consumed power reduced portion, for deciding whether each bit of the first current input is inverted or not in order to reduce the consumed power of the first consumed power reduced portion based on the state of each bit of the first current input and the last input, and a first inverting portion, on receipt of the first current input and the result of decision obtained by the first inversion deciding portion, for outputting, to the first consumed power reduced portion, the first current input as it is or a signal obtained by inverting the first current input based on the result of decision, the second structure comprising a second consumed power reduced portion whose consumed power is to be reduced and which can set all internal nodes to a constant level, a second inversion deciding portion for receiving a second current input including a plurality of bits to be input to the second consumed power reduced portion after the all internal nodes of the second consumed power reduced portion are set to the constant level, and for deciding whether each bit of the second current input is inverted or not in order to reduce the consumed power of the second consumed power reduced portion based on the state of each bit of the second current input, and a second inverting portion, on receipt of the second current input and the result of decision obtained by the second inversion deciding portion, for outputting, to the second consumed power reduced portion, the second current input as it is or a signal obtained by inverting the second current input based on the result of decision, wherein the output of the second consumed power reduced portion having the first or second structure on a first stage is input as the first or second current input to the first or second inversion deciding portion and the first or second inverting portion on a second stage.

An eighth aspect of the present invention is directed to the semiconductor integrated circuit, further comprising another inverting portion for, on receipt of the output of the consumed power reduced portion and the result of decision obtained by the inversion deciding portion, outputting the output of the consumed power reduced portion as it is or a signal obtained by inverting the output of the consumed power reduced portion based on the result of decision.

A ninth aspect of the present invention is directed to the semiconductor integrated circuit wherein the consumed power reduced portion is an adder.

A tenth aspect of the present invention is directed to the semiconductor integrated circuit wherein the consumed power reduced portion further receives the result of decision and includes a circuit for inversion which is used only when the inverting portion inverts the current input, and selects, based on the result of decision, the case where the current input is processed by using the circuit for inversion and the case where the current input is processed without using the circuit for inversion.

An eleventh aspect of the present invention is directed to the semiconductor integrated circuit wherein the consumed power reduced portion is a multiplier.

A twelfth aspect of the present invention is directed to the semiconductor integrated circuit, further comprising a memory for outputting the current input and a microprocessor for receiving the output of the another inverting portion, the consumed power reduced portion being a bus between the memory and the microprocessor.

A thirteenth aspect of the present invention is directed to the semiconductor integrated circuit, further comprising a cache memory for outputting the current input and a CPU for receiving the output of the another inverting portion, the consumed power reduced portion being a bus between the cache memory and the CPU.

A fourteenth aspect of the present invention is directed to the semiconductor integrated circuit, further comprising another inverting portion for, on receipt of the output of the consumed power reduced portion and the result of decision obtained by the inversion deciding portion, outputting the output of the consumed power reduced portion as it is or a signal obtained by inverting the output of the consumed power reduced portion based on the result of decision.

A fifteenth aspect of the present invention is directed to the semiconductor integrated circuit wherein the consumed power reduced portion is an adder.

A sixteenth aspect of the present invention is directed to the semiconductor integrated circuit wherein the consumed power reduced portion further receives the result of decision and includes a circuit for inversion which is used only when the inverting portion inverts the current input, and selects, based on the result of decision, the case where the current input is processed by using the circuit for inversion and the case where the current input is processed without using the circuit for inversion.

An seventeenth aspect of the present invention is directed to the semiconductor integrated circuit wherein the consumed power reduced portion is a multiplier.

A eighteenth aspect of the present invention is directed to the semiconductor integrated circuit, further comprising a memory for outputting the current input and a microprocessor for receiving the output of the another inverting portion, the consumed power reduced portion being a bus between the memory and the microprocessor.

A nineteenth aspect of the present invention is directed to the semiconductor integrated circuit, further comprising a cache memory for outputting the current input and a CPU for receiving the output of the another inverting portion, the consumed power reduced portion being a bus between the cache memory and the CPU.

According to the first aspect of the present invention, each bit of the current input is inverted by the inversion deciding portion and the first inverting portion to reduce the consumed power of the consumed power reduced portion. Consequently, the consumed power of the semiconductor integrated circuit can be reduced.

According to the second aspect of the present invention, the count portion and the comparing portion can give an instruction to the first inverting portion to reduce the consumed power of the consumed power reduced portion by inverting each bit of the current input.

According to the third aspect of the present invention, the combination storing portion can give an instruction to the first inverting portion to reduce the consumed power of the consumed power reduced portion by inverting each bit of the current input.

According to the fourth aspect of the present invention, the consumed power of the consumed power reduced portion capable of setting all internal nodes to the constant level can be reduced by inverting each bit of the current input by means of the inversion deciding portion and the first inverting portion.

According to the fifth aspect of the present invention, an instruction can be given to the first inverting portion to reduce the consumed power of the consumed power reduced portion by inverting each bit of the current input based on only the current input.

According to the sixth aspect of the present invention, the combination storing portion can give an instruction to the first inverting portion to reduce the consumed power of the consumed power reduced portion by inverting each bit of the current input based on only the current input.

According to the seventh aspect of the present invention, the consumed power of respective consumed power reduced portions which are connected in series can be reduced. According to the eighth aspect of the present invention, the present invention can be applied to the consumed power reduced portion in which the result of processing obtained by inputting the inverted current input and the result of processing obtained by inputting the same current input as it is have the inverted relationship.

According to the ninth aspect of the present invention, the present invention is applied to the adder so that the consumed power can be reduced.

According to the tenth aspect of the present invention, the inverted current input is processed by using the circuit for inversion so that the consumed power can be reduced.

According to the eleventh aspect of the present invention, the present invention is applied to the multiplier so that the consumed power can be reduced.

According to the twelfth aspect of the present invention, the present invention is applied to the bus between the memory and the microprocessor so that the consumed power can be reduced.

According to the thirteenth aspect of the present invention, the present invention is applied to the bus between the cache memory and the CPU so that the consumed power can be reduced.

According to the fourteenth aspect of the present invention, the present invention can be applied to the consumed power reduced portion in which the result of processing obtained by inputting the inverted current input and the result of processing obtained by inputting the same current input as it is have the inverted relationship.

According to the fifteenth aspect of the present invention, the present invention is applied to the adder so that the consumed power can be reduced.

According to the sixteenth aspect of the present invention, the inverted current input is processed by using the circuit for inversion so that the consumed power can be reduced.

According to the seventeenth aspect of the present invention, the present invention is applied to the multiplier so that the consumed power can be reduced.

According to the eighteenth aspect of the present invention, the present invention is applied to the bus between the memory and the microprocessor so that the consumed power can be reduced.

According to the nineteenth aspect of the present invention, the present invention is applied to the bus between the cache memory and the CPU so that the consumed power can be reduced.

In order to solve the above-mentioned problems, it is an object of the present invention to provide a semiconductor integrated circuit and a method for reducing the consumed power by performing signal processing based on the representation of twos complement without changing the order of input signals.

These and other objects, features, aspects and advantages of the present invention will become more apparent from the following detailed description of the present invention when taken in conjunction with the accompanying drawings.

BRIEF DESCRIPTION OF THE DRAWINGS

FIG. 21 shows the operation of an exclusive OR circuit 4 in FIG. 20;

FIGS. 23(a) and 23(b) show a general expression and an example of calculation of an adder 16, respectively;

FIG. 26 is a diagram showing the structure of a selector 17e;

FIGS. 27(a) and 27(b) show a general expression and an example of calculation of the multiplier 17, respectively;

DESCRIPTION OF THE PREFERRED EMBODIMENTS

First Embodiment

Figure 1:
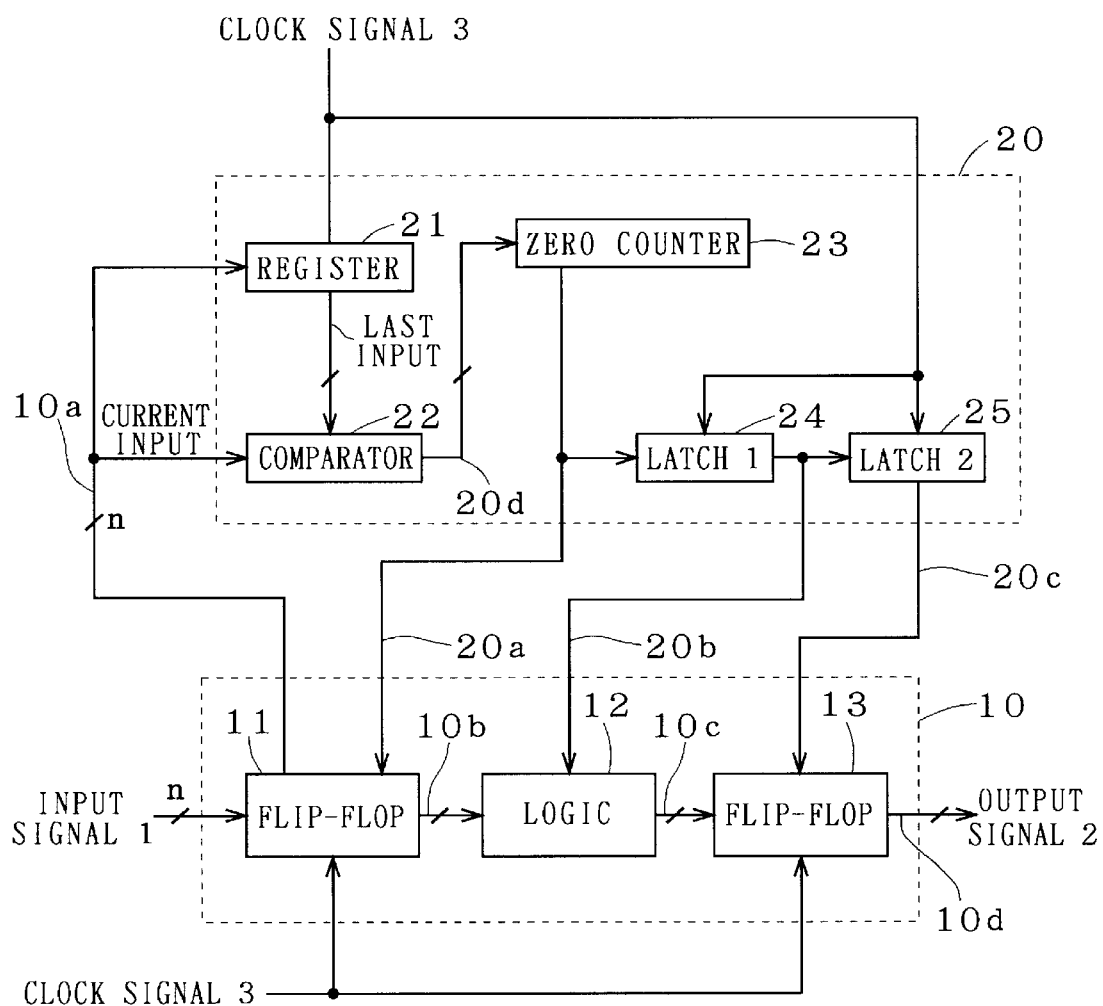
FIG. 1 is a block diagram showing main parts of the structure of a semiconductor integrated circuit according to a first embodiment of the present invention.

FIG. 1 is a block diagram showing main parts of a structure of a semiconductor integrated circuit according to a first embodiment of the present invention. As shown in FIG. 1, the semiconductor integrated circuit according to the present invention comprises a clock synchronous system 10 and a control portion 20.

First of all, the clock synchronous system 10 will be described below. The clock synchronous system 10 includes a flip-flop 11 which serves as an inverting portion, a logic 12 that serves as a consumed power reduced portion whose consumed power is to be reduced, and a flip-flop 13 which serves as an inverting portion. The flip-flop 11 receives an input signal 1, a clock signal 3, and the signal of a node 20a of the control portion 20. The input signal 1 has n bits (n is an integer). The flip-flop 11 has the function of an ordinary flip-flop circuit for holding the input signal 1 at the timing of an edge of the clock signal 3, and the function of outputting, to a node 10b, the input signal 1 as it is or a signal obtained by inverting the input signal 1 corresponding to the value of the signal of the node 20a. The signal of the node 20a indicates whether the input signal 1 is inverted or not. A node 10a holds the input signal 1 during a cycle of the clock signal 3. The input signal 1 and the signal of the node 10a corresponding to the input signal 1 will be hereinafter referred to as current inputs.

The logic 12 receives the signal of the node 10b and the signal of a node 20b of the control portion 20. The logic 12 includes a circuit which is used only in the case where the signal of the node 10b is obtained by inverting the input signal 1 (hereinafter referred to as a circuit 12a for inversion). The signal of the node 20b indicates that the signal of the node 10b is obtained by inverting the input signal 1 or not. According to the value of the signal of the node 20b, the signal of the node 10b is processed by using or without using the circuit 12a for inversion and the result of processing is output to a node 10c.

The flip-flop 13 receives the signal of the node 10c, the clock signal 3, and the signal of a node 20c. The flip-flop 13 has the function of an ordinary flip-flop circuit for holding the signal of the node 10c at the timing of the edge of the clock signal 3, and the function of outputting, to a node 10d, the signal of the node 10c as it is or a signal obtained by inverting the signal of the node 10c corresponding to the value of the signal of the node 20c. The signal of the node 20c indicates that the signal of the node 10b is obtained by inverting the input signal 1 or not. The signal of the node 10d is an output signal 2.

The control portion 20 will be described below. The control portion 20 includes a register 21 which serves as a last input storing portion, a comparator 22, a zero counter 23 which serves as a count portion, a latch 24, and a latch 25. The comparator 22 and the zero counter 23 form an inversion deciding portion. The register 21 receives the clock signal 3 and the signal of the node 10a to hold the signal of the node 10a prior to a cycle of the clock signal 3. The signal held by the register 21 will be hereinafter referred to as a last input. The comparator 22 receives the current input and the last input to compare each bit of the current input with that of the last input. The zero counter 23 receives the result of comparison obtained by the comparator 22 to count the number of bits having the same level, which correspond to each other, of the current and last inputs based on the result of comparison and to output a signal having the "H" or "L" level to the node 20a according to the relationship between the count number and a predetermined value. The latch 24 receives the clock signal 3 and the signal of the node 20a to hold the signal of the node 20a in response to the clock signal 3 and to output the held signal to the node 20b. The latch 25 receives the clock signal 3 and the signal of the node 20b to hold the signal of the node 20b in response to the clock signal 3 and to output the held signal to the node 20c.

Figure 2:
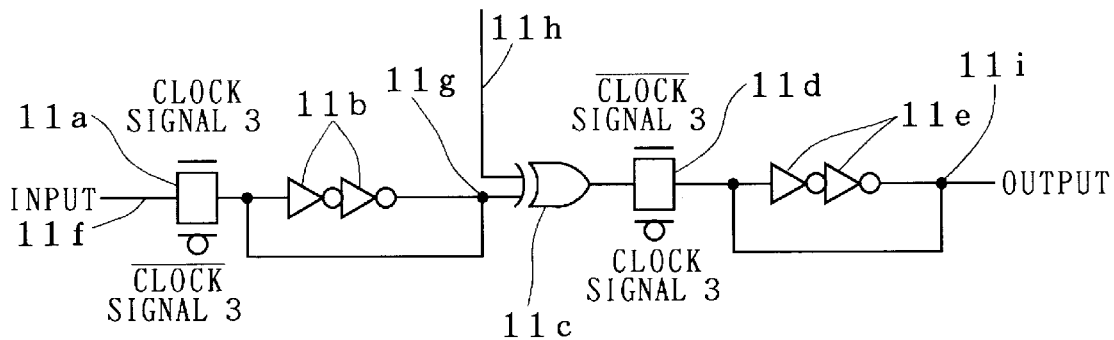
FIG. 2 is a circuit diagram showing an example of flip-flops 11 and 13.

FIG. 2 is a circuit diagram showing an example of the flip-flops 11 and 13. The flip-flops 11 and 13 have the same circuit structure. The gate electrodes of PMOS and NMOS transistors forming complementary transistors 11a and 11d receive the clock signal 3. Inverters 11b and 11e are used for holding signals. An exclusive OR circuit 11c inputs the signals of a node 11g and a node 11h. If the signal of the node 11h has the "L" level, the exclusive OR circuit 11c becomes equivalent to a buffer. Consequently, the exclusive OR circuit 11c outputs the signal of the node 11g as it is. If the signal of the node 11h has the "H" level, the exclusive OR circuit 11c becomes equivalent to an inverter. Consequently, the exclusive OR circuit 11c inverts the signal of the node 11g to be output. The flip-flops 11 and 13 are prepared by the bit width n of the input signal 1. As shown in FIGS. 1 and 2, the flip-flop 11 has a structure in which a node 11f receives the input signal 1, the node 11g is connected to the node 10a (including the cases which are not shown), the node 11h is connected to the node 20a, and a node 11i is connected to the node 10b. In the flip-flop 13, the node 11f is connected to the node 10c, the node 11h is connected to the node 20c, and the node 11i is connected to the node 10d.

Figure 3:
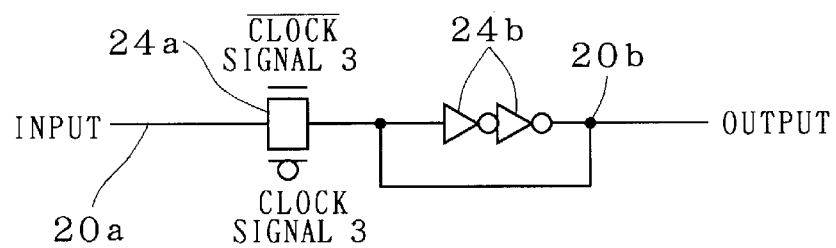
FIG. 3 is a circuit diagram showing an example of a latch 24.
Figure 4:
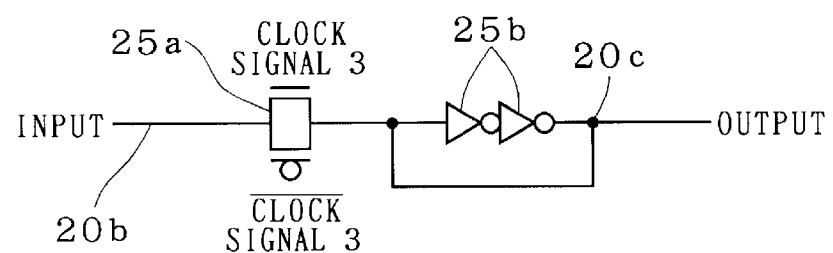
FIG. 4 is a circuit diagram showing an example of a latch 25.

FIG. 3 is a circuit diagram showing an example of the latch 24. With reference to FIGS. 1 and 3, a complementary transistor 24a is conductive to fetch the signal of the node 20a if the clock signal 3 has the "L" level, and is non-conductive if the clock signal 3 has the "H" level, and an inverter 24b holds the signal fetched when the clock signal 3 has the "L" level, and outputs the held signal to the node 20b. FIG. 4 is a circuit diagram showing an example of the latch 25. With reference to FIGS. 1 and 4, a complementary transistor 25a is conductive to fetch the signal of the node 20b if the clock signal 3 has the "H" level, and is non-conductive if the clock signal 3 has the "L" level, and an inverter 25b holds the signal fetched when the clock signal 3 has the "H" level, and outputs the held signal to the node 20c. The latches 24 and 25 are prepared by the bit width n of the input signal 1.

Figure 5:
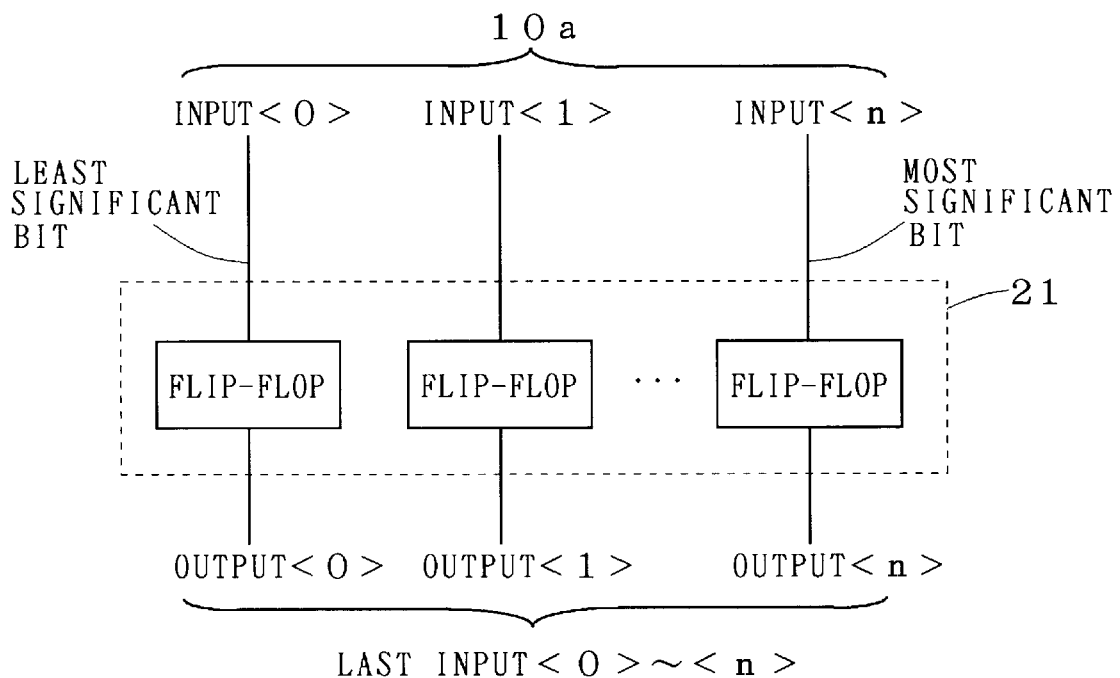
FIG. 5 is a circuit diagram showing an example of a register 21.
Figure 6:
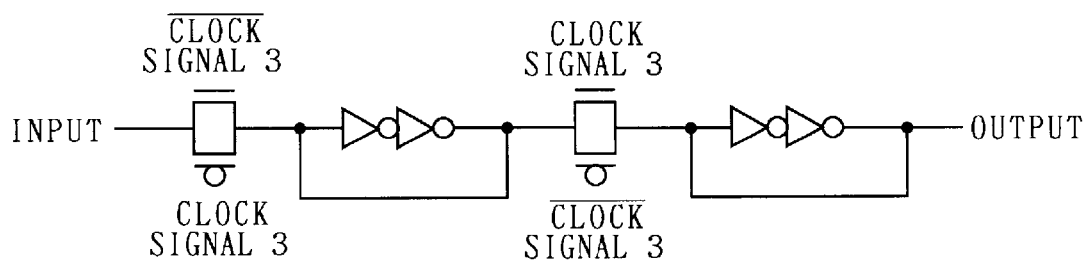
FIG. 6 is a diagram showing the structure of a flip-flop circuit used for the register 21.

FIG. 5 is a circuit diagram showing an example of the register 21. The register 21 has flip-flop circuits arranged by the bit width n of the input signal 1. FIG. 6 is a diagram showing the structure of the flip-flop circuit. The flip-flop circuit is formed by the combination of the latches 24 and 25.

Figure 7:
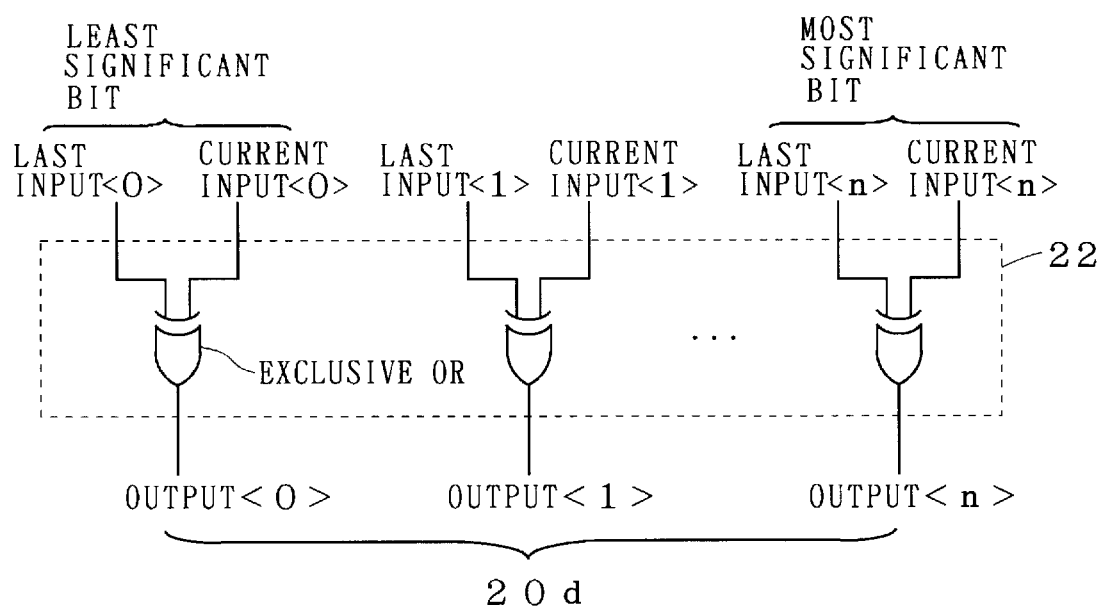
FIG. 7 is a circuit diagram showing an example of a comparator 22.

FIG. 7 is a circuit diagram showing an example of the comparator 22. The comparator 22 has exclusive OR circuits arranged by the bit width n of the input signal 1. The comparator 22 outputs a signal having the "L" level if the last and current inputs are the same, and outputs a signal having the "H" level if the last and current inputs are different from each other.

Figure 8:
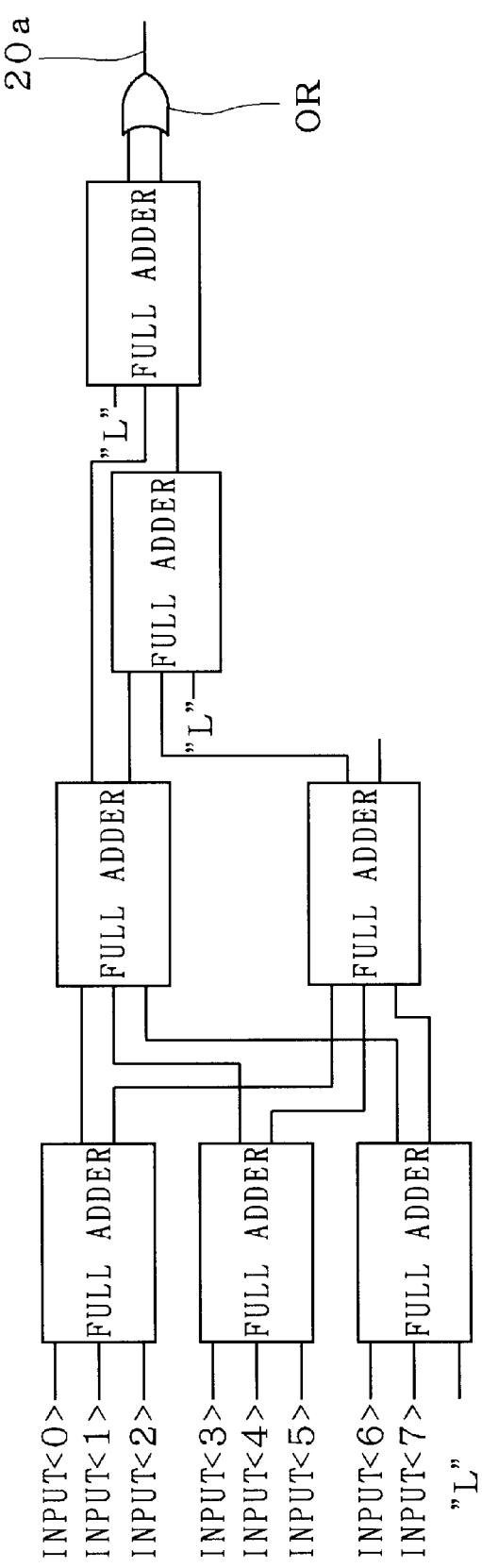
FIG. 8 is a circuit diagram showing an example of a zero counter 23.
Figure 9:
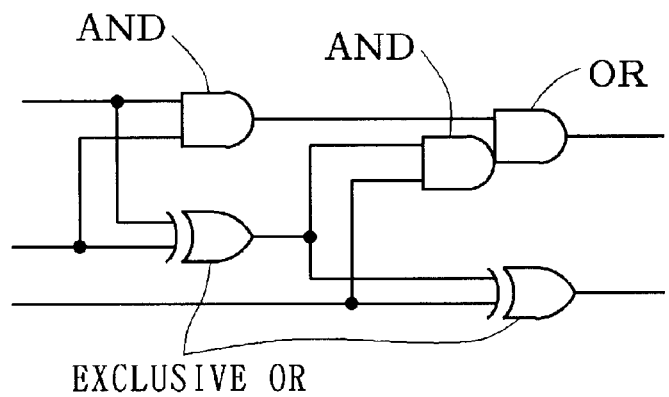
FIG. 9 is a circuit diagram showing the structure of a full adder.
Figure 10:
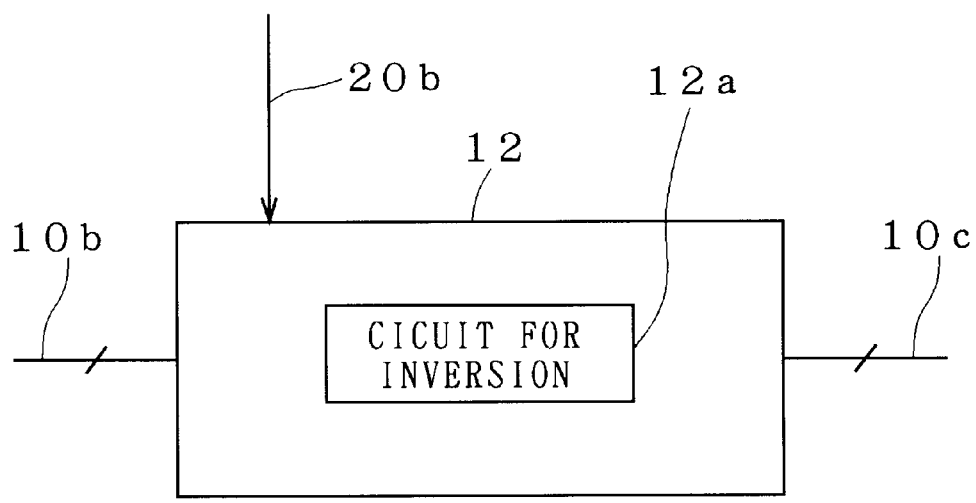
FIG. 10 is a circuit diagram showing the structure of a logic 12.

FIG. 8 is a circuit diagram showing an example of the zero counter 23. The zero counter 23 includes a full adder. In the zero counter 23 shown in FIG. 8, it is assumed that the input signal 1 has 8 bits. When half of 8 bits or more, that is, 4 inputs or more have the "H" level, a signal having the "H" level is output. FIG. 9 is a circuit diagram showing the structure of the full adder. FIG. 10 is a circuit diagram showing the structure of the logic 12. The logic 12 includes the circuit 12a for inversion as described above. If the value of the node 20b has the "L" level, that is, the signal of the node 10b is the exact input signal 1, the logic 12 processes the signal of the node 10b without using the circuit 12a for inversion. When the value of the node 20b has the "H" level, that is, the signal of the node 10b is obtained by inverting the input signal 1, the logic 12 processes the signal of the node 10b by using the circuit 12a for inversion.

Figure 30:
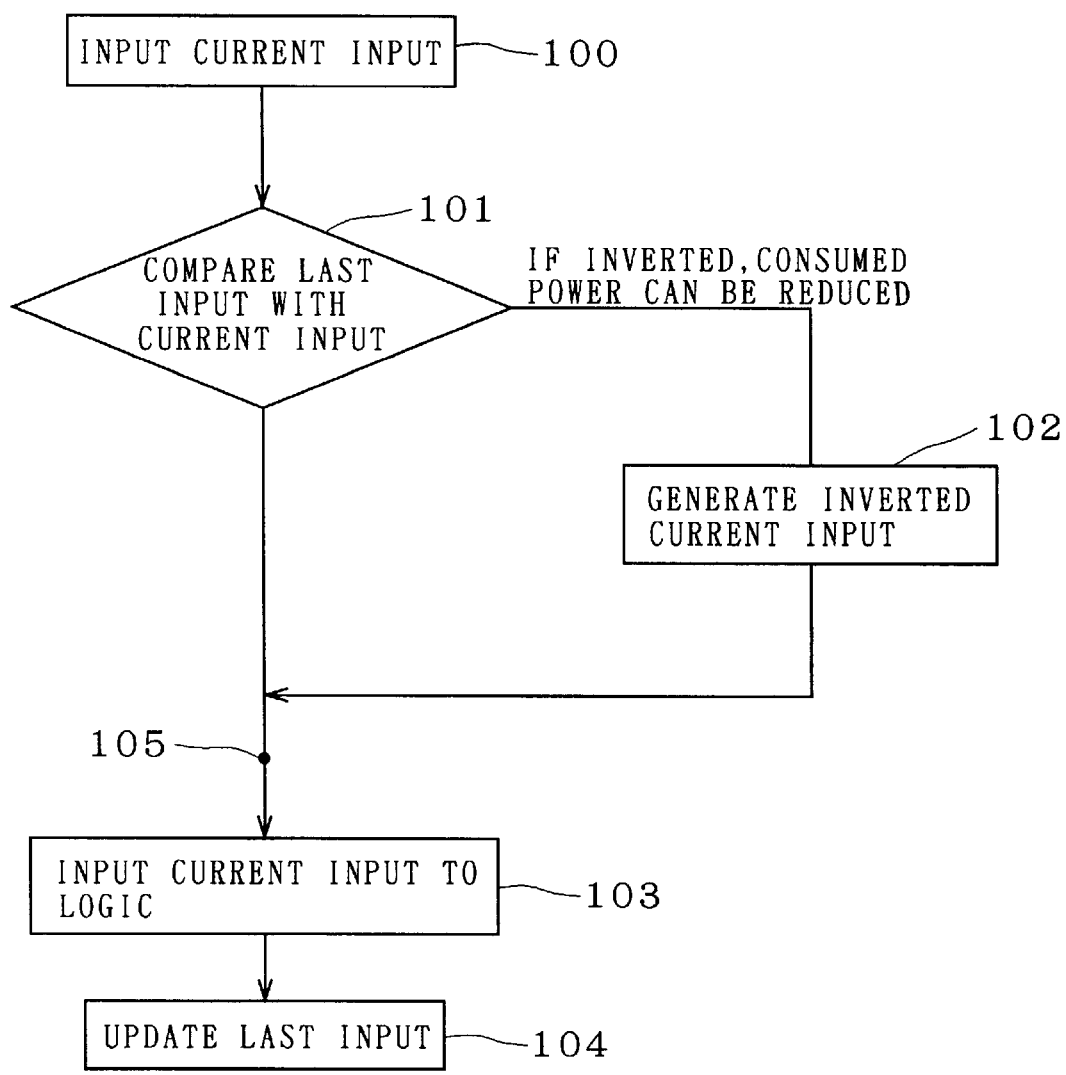
FIG. 30 is a flowcha showing a method for reducing the consumed power of the semiconductor integrated circuit according to the present invention.

FIG. 30 is a flowchart showing a method for reducing the consumed power of the semiconductor integrated circuit according to the present invention. The procedure is as follows. At Step 100, the last input is stored in the register 21 in advance. At Step 101, it is decided whether each bit of the current input is inverted or not in order to reduce the consumed power of the logic 12 based on the state of each bit of the current input and the last input on receipt of the last input stored in the register 21 and the current input including a plurality of bits to be input to the logic 12 after the last input is input to the logic 12. At Step 102, each bit of the current input is inverted if the consumed power of the logic 12 is reduced by inverting the current input. At Step 103, the current input is sent to the logic 12. At Step 104, the current input is stored as the last input in the register 21. Step 104 may be placed on a node 105.

Figure 11:
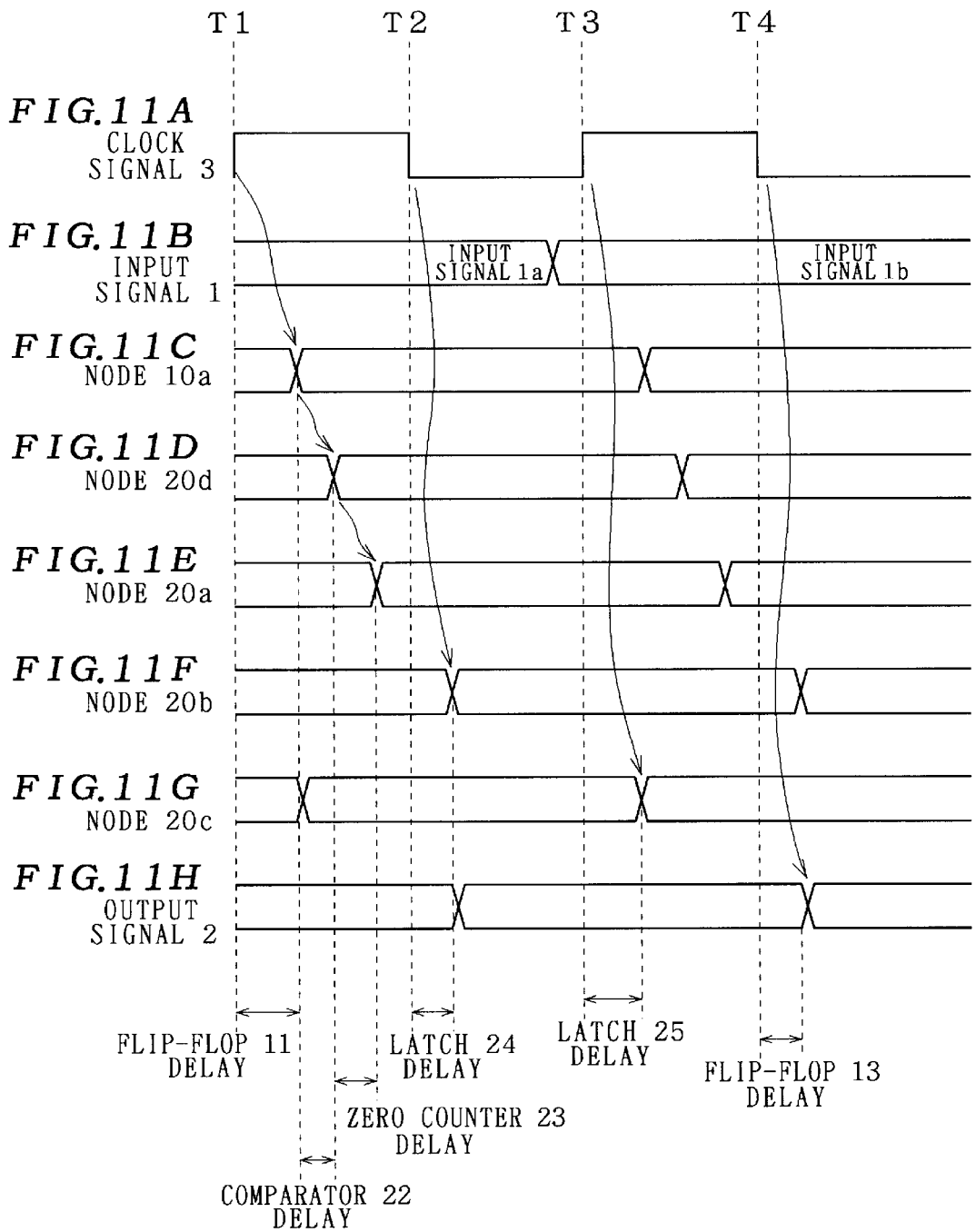
FIGS. 11A–11H is a timing chart of a signal in the semiconductor integrated circuit shown in FIG. 1.

The method for reducing the consumed power will be described below with reference to a timing chart of FIG. 11 showing the flow of signals. At a time T1, when the level of the clock signal 3 is changed from "L" to "H", the flip-flop 11 fetches an input signal 1a. The fetched input signal 1a is output to the node 10a. The signal of the node 10a is a current input. The current input is sent to the comparator 22 provided in the control portion 20.

The comparator 22 compares the current input with the last input held by the register 21 to output the result of comparison to the node 20d. The comparison is performed for each bit by the comparator 22. If the current input and the last input have the same value, a signal having the "L" level is output to the node 20d. If the current input and the last input have different values, a signal having the "H" level is output to the node 20d. The signal of the node 20d is sent to the zero counter 23.

Then, the zero counter 23 counts the number of bits having the "L" level of the signal of the node 20d. Depending on whether the count number is greater than a predetermined number or not, a signal having the "L" or "H" level is output to the node 20a. For example, in the case where the input signal 1 has 8 bits, the zero counter 23 shown in FIG. 8 determines half of the bit width of the input signal 1, that is, 4 bits. If the number of the bits having the "L" level of the signal of the node 20d is less than 4, a signal having the "L" level is output to the node 20a. If the number of the bits having the "H" level of the signal of the node 20d is equal to or more than 4, a signal having the "H" level is output to the node 20a. The signal of the node 20a is sent to the latch 24 and the flip-flop 11 provided in the clock synchronous system 10.

If the signal of the node 20a has the "L" level, the flip-flop 11 does not invert the input signal 1. If the signal of the node 20a has the "H" level, the flip-flop 11 inverts the input signal 1. The latch 24 is non-conductive while the clock signal 3 has the "H" level. Consequently, the node 20b is not changed.

At a time T2, when the clock signal 3 is set to the "L" level, the flip-flop 11 outputs the input signal 1 to the logic 12 through the node 10b. The latch 24 becomes conductive to output the signal of the node 20a to the node 20b. The signal of the node 20b is sent to the logic 12. Depending on whether the signal of the node 20b has the "L" or "H" level, the logic 12 can decide whether the signal of the node 10b is obtained by inverting the input signal 1 or not. If the signal of the node 20b has the "L" level, that is, the signal of the node 10b is the exact input signal 1, the logic 12 processes the signal of the node 10b without using the circuit 12a for inversion and outputs the processed signal to the node 10c. If the signal of the node 20b has the "H" level, that is, the signal of the node 10b is obtained by inverting the input signal 1, the logic 12 processes the signal of the node 10b by using the circuit 12a for inversion and outputs the processed signal to the node 10c. The logic 12 may have a circuit structure where the value of the signal of the node 10c which is obtained by processing the signal of the node 10b by means of the circuit 12a for inversion is equal to a value obtained by inverting the value of the signal of the node 10c that is obtained by processing the signal of the node 10b without using the circuit 12a for inversion. According to the present embodiment, the logic 12 has such a circuit structure. The register 21 fetches the current input. The fetched current input is used as a last input when the clock signal 3 is set to the "H" level at a next time T3. The latch 25 is non-conductive while the clock signal 3 has the "L" level. Consequently, the node 20c is not changed.

At the time T3, when the clock signal 3 is set to the "H" level, the flip-flop 13 fetches the signal of the node 10c. The latch 25 becomes conductive to output the signal of the node 20b to the node 20c. The signal of the node 20c is sent to the flip-flop 13.

Depending on whether the signal of the node 20c has the "L" or "H" level, the flip-flop 13 can decide whether the logic 12 processes the signal of the node 10b and outputs the processed signal to the node 10c without or by using the circuit 12a for inversion. If the signal of the node 20c has the "L" level, that is, the logic 12 processes the signal of the node 10b and outputs the processed signal to the node 10c without using the circuit 12a for inversion, the signal of the node 10c is not inverted. If the signal of the node 20c has the "H" level, that is, the logic 12 processes the signal of the node 10b and outputs the processed signal to the node 10c by using the circuit 12a for inversion, the signal of the node 10c is inverted.

As described above, accordingly, the value of the signal of the node 10c which is obtained by processing the signal of the node 10b to be output from the logic 12 by using the circuit 12a for inversion is equal to a value which is obtained by inverting the value of the signal of the node 10c which is obtained by processing the signal of the node 10b to be output from the logic 12 without using the circuit 12a for inversion. In the case where the logic 12 processes the signal of the node 10b and outputs the processed signal to the node 10c by using the circuit 12a for inversion, the flip-flop 13 inverts the signal of the node 10c. Consequently, in the cases where the logic 12 inputs and processes the input signal 1 without and by using the circuit 12a for inversion, output signals 2 sent to the node 10d which will be described below have the same value. The flip-flop 11 fetches a new input signal 1b.

At a time T4, when the clock signal 3 is set to the "L" level, the flip-flop 13 outputs, to the node 10d, the signal of the node 10c as it is or a signal obtained by inverting the signal of the node 10c.

The count number obtained by the zero counter 23 represents the number of bits having different values of the last and current inputs. Ordinarily, the number of gates which operate becomes smaller as the last input approaches the current input. Consequently, the consumed power is reduced. The current input is compared with the last input before performing the processing of the logic 12 (for example, operation or the like). If the current input is closer to the last input, the current input is used for the operation as it is. If an input obtained by inverting the current input is closer to the last input, inversion is carried out to perform the processing. Thus, the consumed power of the logic 12 can be reduced. As described above, a portion for implementing the function of inverting the signals of the control portion 20, the flip-flop 11 and the flip-flop 13 has overhead so that the consumed power is increased more than in an ordinary system. If the amount of the consumed power which is reduced by inverting the input is bigger than that of the consumed power which is increased by the overhead, the consumed power can be reduced as a whole.

Second Embodiment

Figure 12:
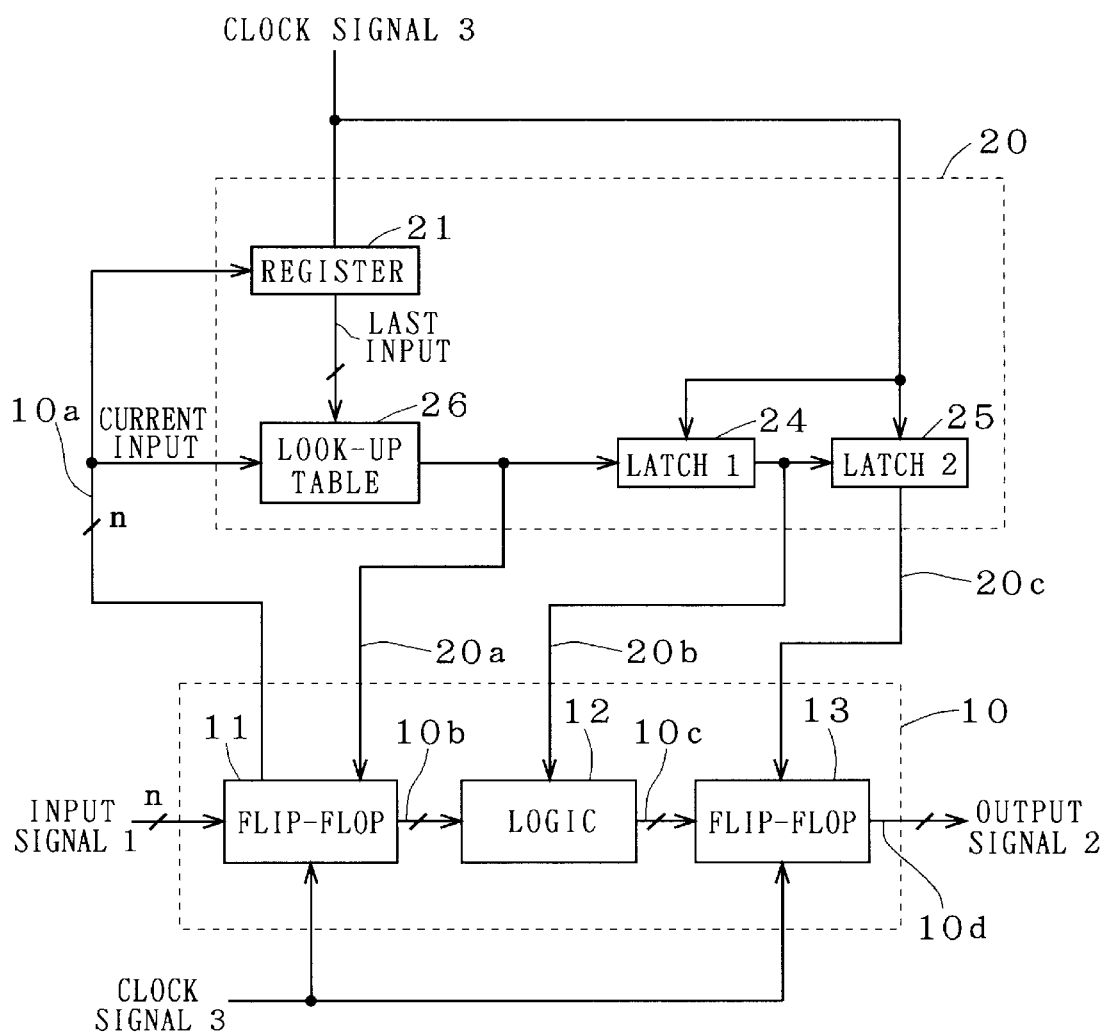
FIG. 12 is a block diagram showing main parts of the structure of a semiconductor integrated circuit according to a second embodiment of the present invention.

FIG. 12 is a block diagram showing main parts of the structure of a semiconductor integrated circuit according to a second embodiment of the present invention. The structure of the semiconductor integrated circuit shown in FIG. 12 is mainly the same as that of FIG. 1. A portion comprising the comparator 22 and the zero counter 23 shown in FIG. 1 is replaced with a look-up table 26.

Figure 13:
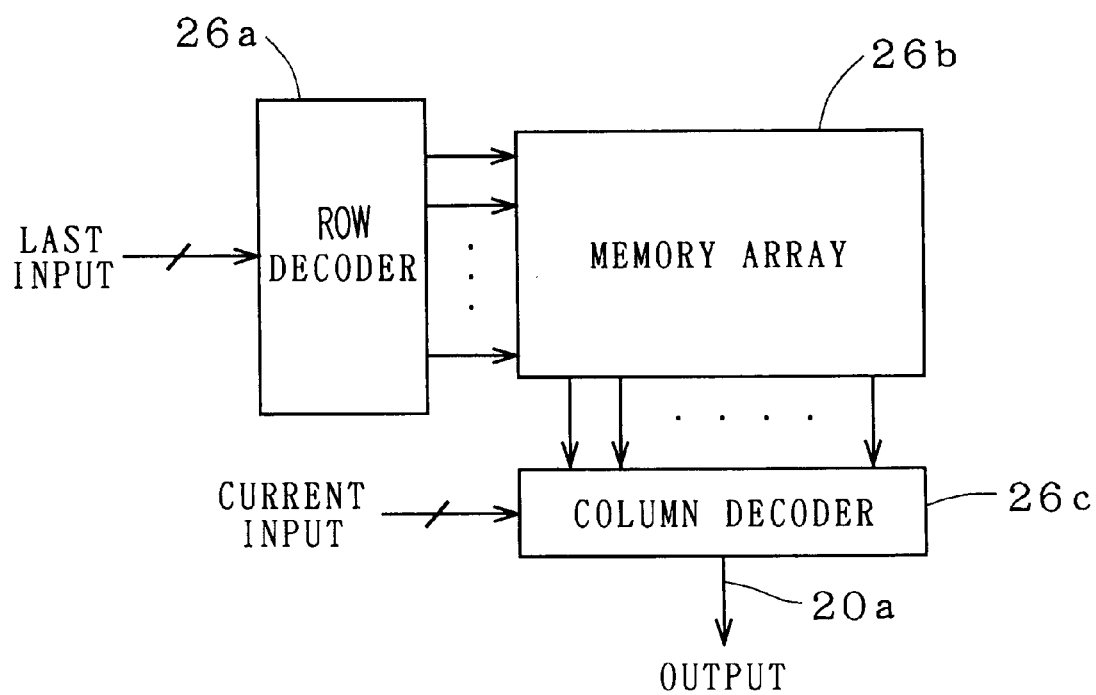
FIG. 13 is a diagram showing an example of a look-up table 26.

FIG. 13 is a diagram showing an example of the look-up table 26. It is sufficient that the look-up table 26 is a general memory formed by a DRAM, a SRAM or a ROM. A last input is sent to a row decoder 26a. A current input is sent to a column decoder 26c. A memory array 26b which serves as a combination storing portion stores, in advance, the combination of the state of bits of the current input and that of bits of the last input which is obtained in the case where the inversion of the current input causes the consumed power to be reduced, and the combination of the state of bits of the current input and that of bits of the last input which is obtained in the case where non-inversion of the current input causes the consumed power to be reduced. In case of the first combination, a 1-bit signal having the "H" level is output to a node 20a. In case of the second combination, a 1-bit signal having the "L" level is output to the node 20a.

Figure 14:
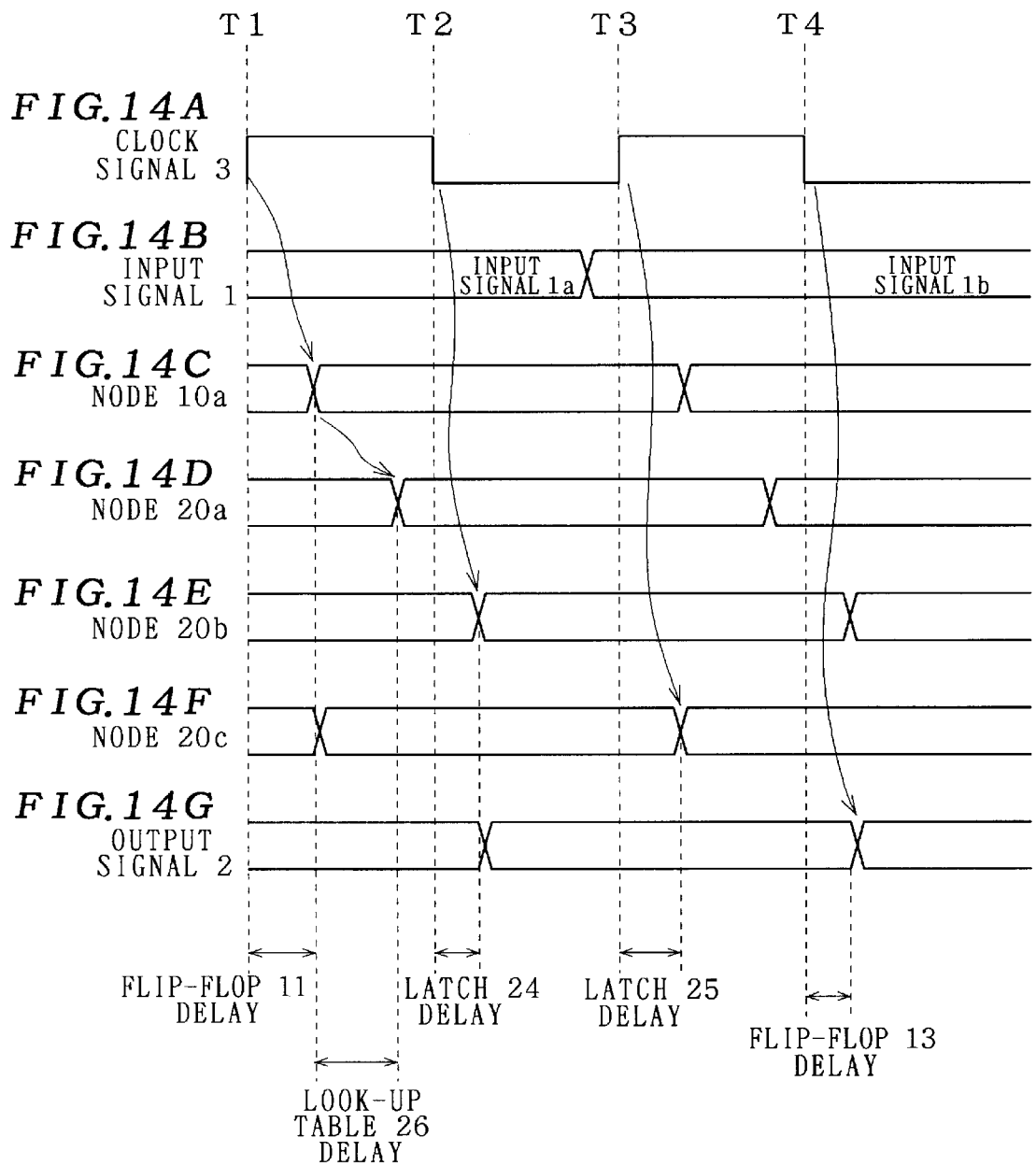
FIGS. 14A–14G is a timing chart of a signal in the semiconductor integrated circuit shown in FIG. 12.

The flow of signals will be described below with reference to a timing chart of FIG. 14. At a time T1, when a clock signal 3 is set to the "H" level, a flip-flop 11 fetches an input signal 1 to be output to a node 10a. The signal of the node 10a is a current input. The current input is sent to the look-up table 26 provided in a control portion 20.

Then, the look-up table 26 inputs, as a low address, a last input held by a register 21 and inputs the current input as a column address, and outputs bits having the "L" or "H" level to the node 20a. The signal of the node 20a is sent to a latch 24 and a flip-flop 11 provided in a clock synchronous system 10.

The flip-flop 11 does not invert the input signal 1 if the signal of the node 20a has the "L" level. The flip-flop 11 inverts the input signal 1 if the signal of the node 20a has the "H" level. The latch 24 is non-conductive while the clock signal 3 has the "H" level. Consequently, a node 20b is not changed.

At a time T2, when the clock signal 3 is set to the "L" level, the same processing as in the first embodiment is performed.

At a time T3, when the clock signal 3 is set to the "H" level, the same processing as in the first embodiment is performed.

At a time T4, when the clock signal 3 is set to the "L" level, the same processing as in the first embodiment is performed. As described above, it is possible to reduce the consumed power by deciding whether the input signal is inverted by using the look-up table 26 or not. A portion for implementing the function of inverting the signals of the control portion 20, the flip-flop 11 and a flip-flop 13 has overhead so that the consumed power is increased more than in an ordinary system. If the amount of the consumed power which is reduced by inverting the input is bigger than that of the consumed power which is increased by the overhead, the consumed power can be reduced as a whole.

Third Embodiment

Figure 15:
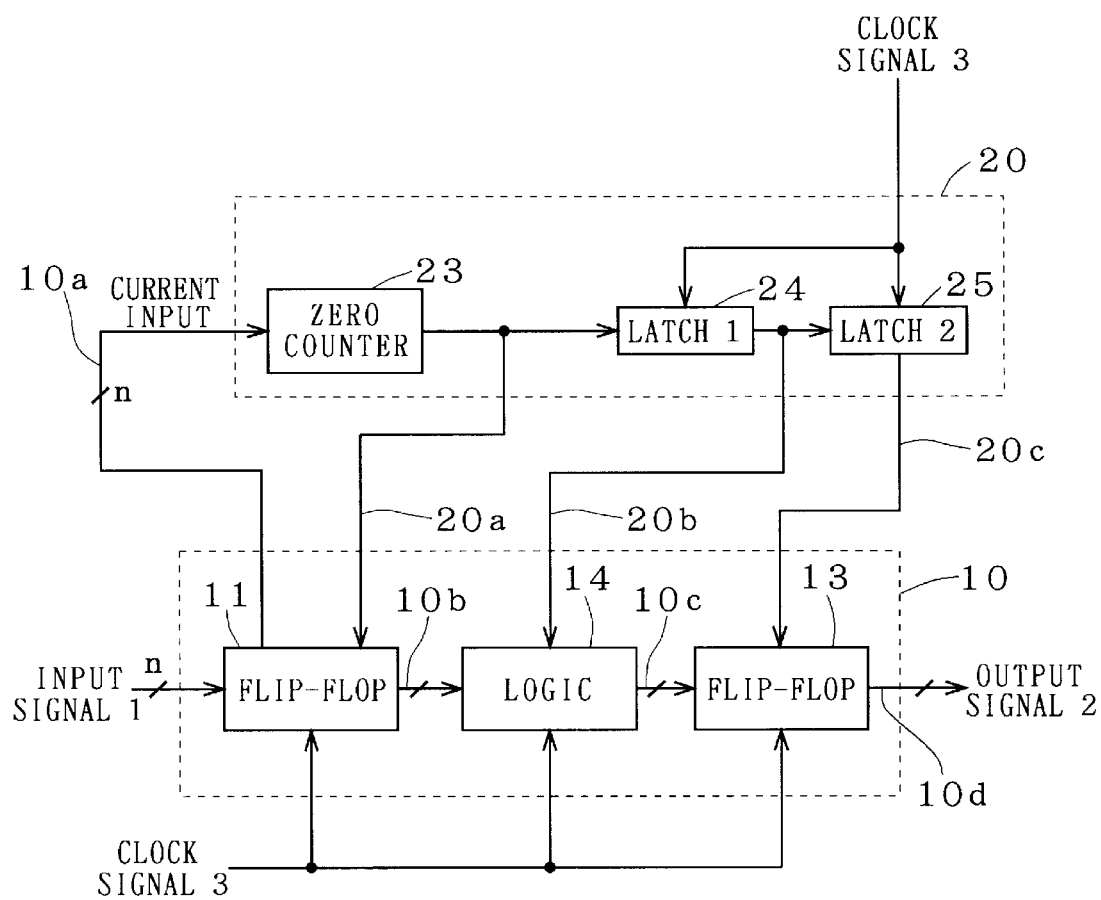
FIG. 15 is a block diagram showing main parts of the structure of a semiconductor integrated circuit according to a third embodiment of the present invention.
Figure 16:
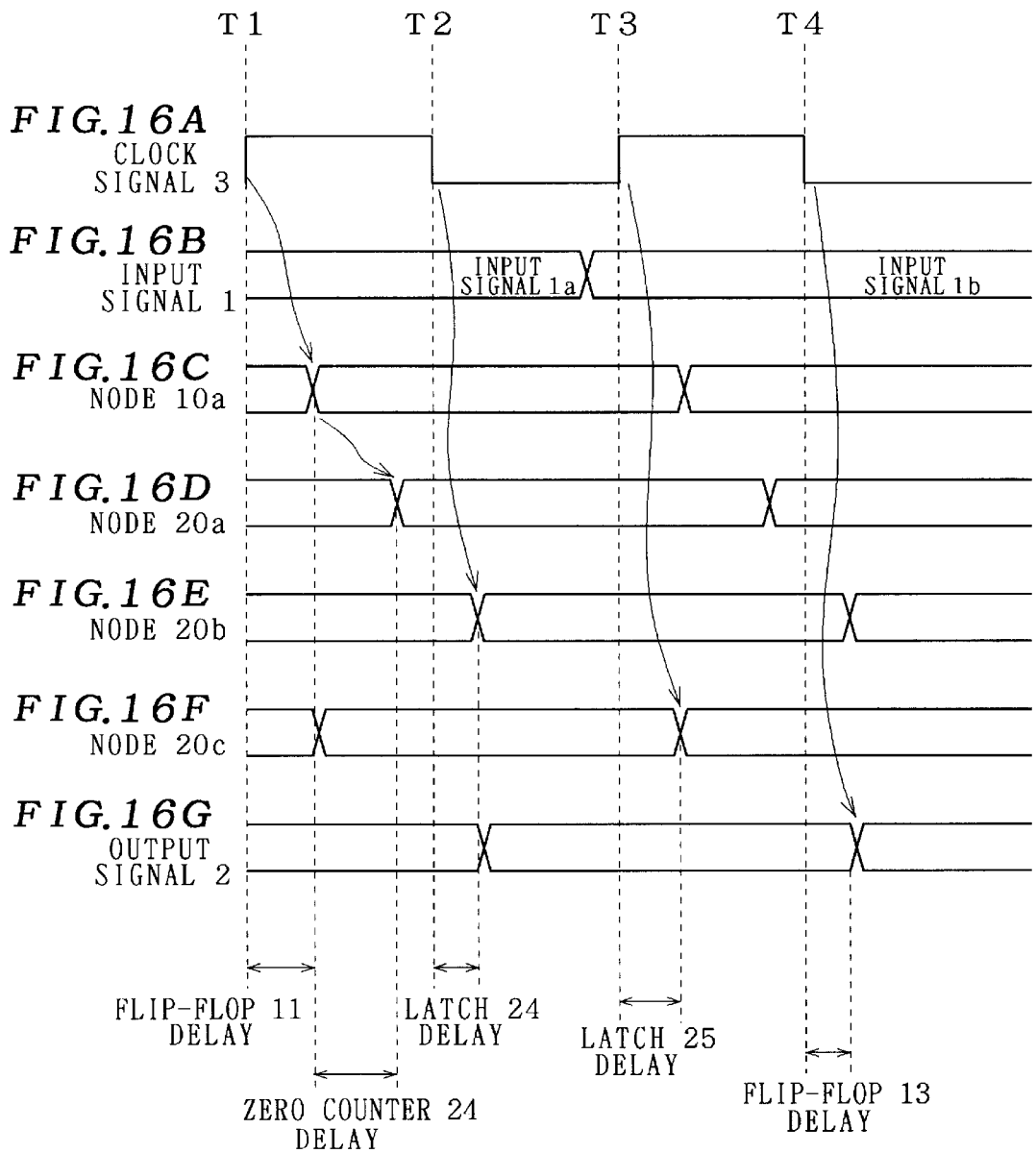
FIGS. 16A–16G is a timing chart of a signal in the semiconductor integrated circuit shown in FIG. 15.

FIG. 15 is a block diagram showing main parts of the structure of a semiconductor integrated circuit according to a third embodiment of the present invention. The structure of the semiconductor integrated circuit shown in FIG. 15 is mainly the same as that of FIG. 1. A portion comprising the register 21, the comparator 22 and the zero counter 23 shown in FIG. 1 is replaced with a zero counter 23. More specifically, the register 21 and the comparator 22 shown in FIG. 1 are removed, the input of the zero counter 23 is connected to a node 10a, and the output of the zero counter 23 is connected to a node 20a. A logic 12 is replaced with a logic 14. The internal structure of the logic 14 is mainly the same as in the first embodiment except that the logic 14 has a predischarge method and further receives a clock signal 3.

The predischarge method is often used for setting all nodes of the logic 14 to the "L" level before the logic 14 performs the processing for an operation. In the present embodiment, all the nodes of the logic 14 are set to the "L" level if the clock signal 3 has the "H" level. If the clock signal 3 has the "L" level, the logic 14 can perform the processing for an operation.

The flow of signals will be described below with reference to a timing chart of FIG. 16A–16G. At a time T1, when the clock signal 3 is set to the "H" level, all the nodes of the logic 14 are set to the "L" level. A flip-flop 11 fetches an input signal 1 to be output to a node 10a. The signal of the node 10a is a current input. The current input is sent to the zero counter 23 provided in a control portion 20.

Then, the zero counter 23 counts the number of bits having the "L" level of the current input of the node 10a. Depending on whether the count number is greater than a predetermined number or not, a signal having the "L" or "H" level is output to the node 20a. For example, in the case where the input signal 1 has 8 bits, the zero counter 23 shown in FIG. 8 determines half of the bit width of the input signal 1, that is, 4 bits. If the number of the bits having the "L" level of the signal of a node 20d is less than 4, a signal having the "L" level is output to the node 20a. If the number of the bits having the "H" level of the signal of the node 20d is equal to or more than 4, a signal having the "H" level is output to the node 20a. The signal of the node 20a is sent to a latch 24 and the flip-flop 11 provided in a clock synchronous system 10.

The flip-flop 11 does not invert the input signal 1 if the signal of the node 20a has the "L" level. The flip-flop 11 inverts the input signal 1 if the signal of the node 20a has the "H" level. The latch 24 is non-conductive while the clock signal 3 has the "H" level. Consequently, a node 20b is not changed.

At a time T2, when the clock signal 3 is set to the "L" level, the same processing as in the first embodiment is performed. When the clock signal 3 is set to the "L" level, the logic 14 can perform the processing such as operation.

At a time T3, when the clock signal 3 is set to the "H" level, the same processing as in the first embodiment is performed. Furthermore, all the nodes of the logic 14 are set to the "L" level.

At a time T4, when the clock signal 3 is set to the "L" level, the same processing as in the first embodiment is performed. Furthermore, the logic 14 can perform the processing such as operation.

The count number obtained by the zero counter 23 represents the number of bits having the "L" level of the current input. The logic 14 has the predischarge method. Consequently, if the number of the bits having the "L" level of the input signal 1 is greater, the number of nodes to be charged in the logic is smaller. Thus, the consumed power is reduced. According to the present invention, the number of the bits having the "L" level of the current input is counted before the logic 14 performs the processing such as operation. If the number of the bits having the "L" level of the exact current input is greater, the current input is used for the processing as it is. If the number of the bits having the "L" level of the inverted current input is greater, the current input is inverted for the processing. Thus, the consumed power of the logic 14 can be reduced.

In the logic 14 having the predischarge method described above, it is decided whether the input signal is inverted by using the zero counter 23 or not so that the consumed power can be reduced. A portion for implementing the function of inverting the signals of the control portion 20, the flip-flop 11 and the flip-flop 13 has overhead so that the consumed power is increased more than in an ordinary system. If the amount of the consumed power which is reduced by inverting the input is bigger than that of the consumed power which is increased by the overhead, the consumed power can be reduced as a whole.

Fourth Embodiment

Figure 17:
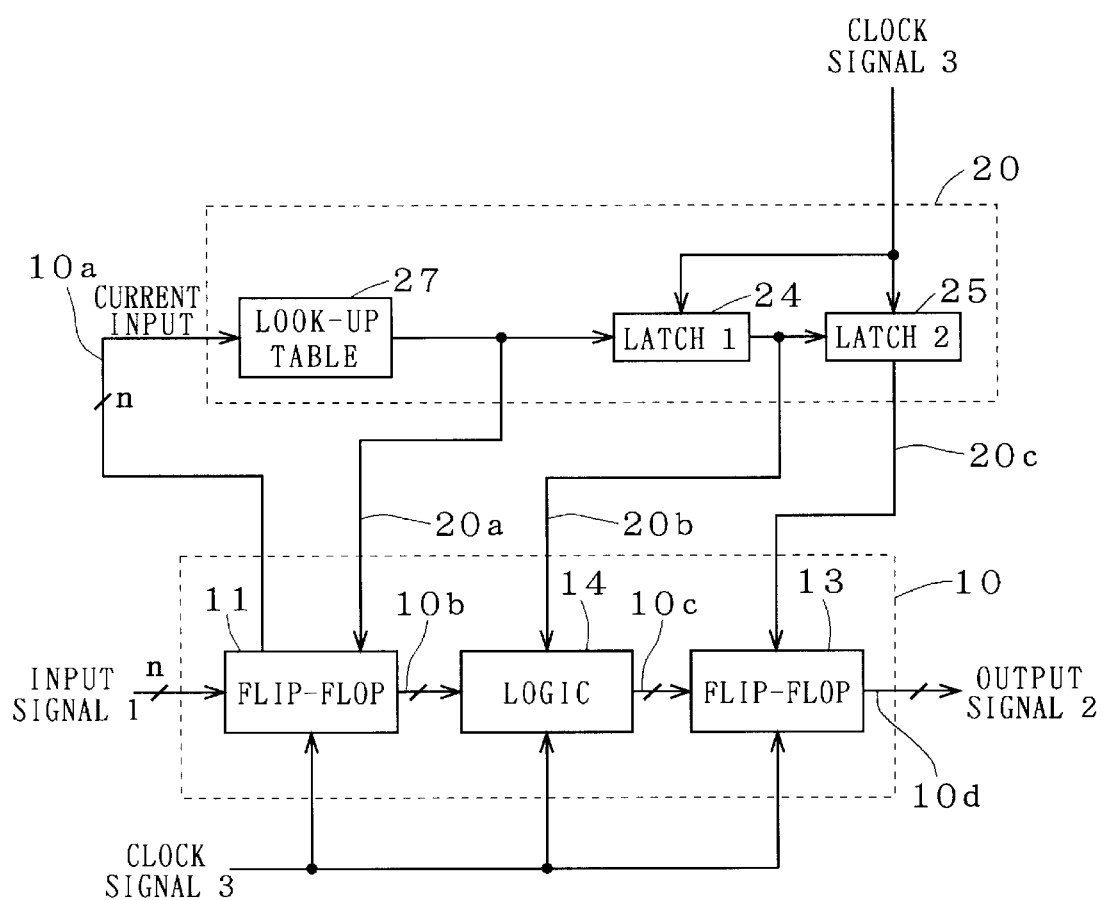
FIG. 17 is a block diagram showing main parts of the structure of a semiconductor imtegrated circuit according to a fourth embodiment of the present invention.

FIG. 17 is a block diagram showing main parts of the structure of a semiconductor integrated circuit according to a fourth embodiment of the present invention. The structure of the semiconductor integrated circuit shown in FIG. 17 is mainly the same as that of FIG. 1. A portion comprising the register 21, the comparator 22 and the zero counter 23 shown in FIG. 1 is replaced with a look-up table 27. More specifically, the register 21, the comparator 22 and the zero counter 23 shown in FIG. 1 are removed, the input of the look-up table 27 is connected to a node 10a, and the output of the look-up table 27 is connected to a node 20a. Furthermore, the logic 12 is replaced with a logic 14. The internal structure of the logic 14 is mainly the same as in the first embodiment except that the logic 14 has a predischarge method and further receives a clock signal 3.

Figure 18:
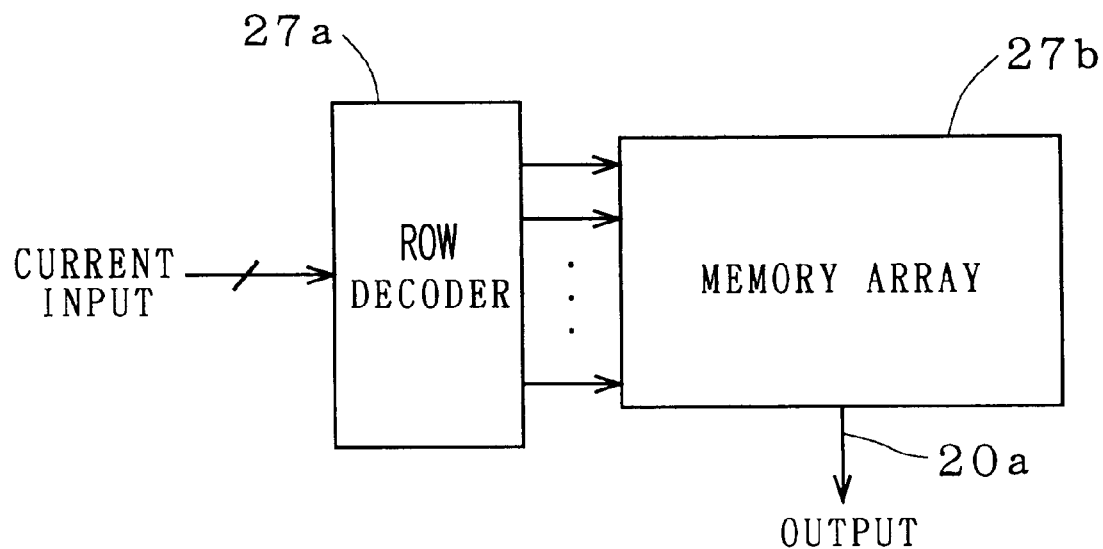
FIG. 18 is a diagram showing an example of a look-up table 27.

FIG. 18 is a diagram showing an example of the look-up table 27. It is sufficient that the look-up table 27 is a general memory formed by a DRAM, a SRAM or a ROM. A current input is sent to a row decoder 27b. A memory array 27b which serves as a combination storing portion stores, in advance, the combination of the state of bits of the current input which is obtained in the case where the inversion of the current input causes the consumed power to be reduced, and the combination of the state of bits of the current input which is obtained in the case where non-inversion of the current input causes the consumed power to be reduced. In case of the first combination, a 1-bit signal having the "H" level is output to the node 20a. In case of the second combination, a 1-bit signal having the "L" level is output to the node 20a.

Figure 19:
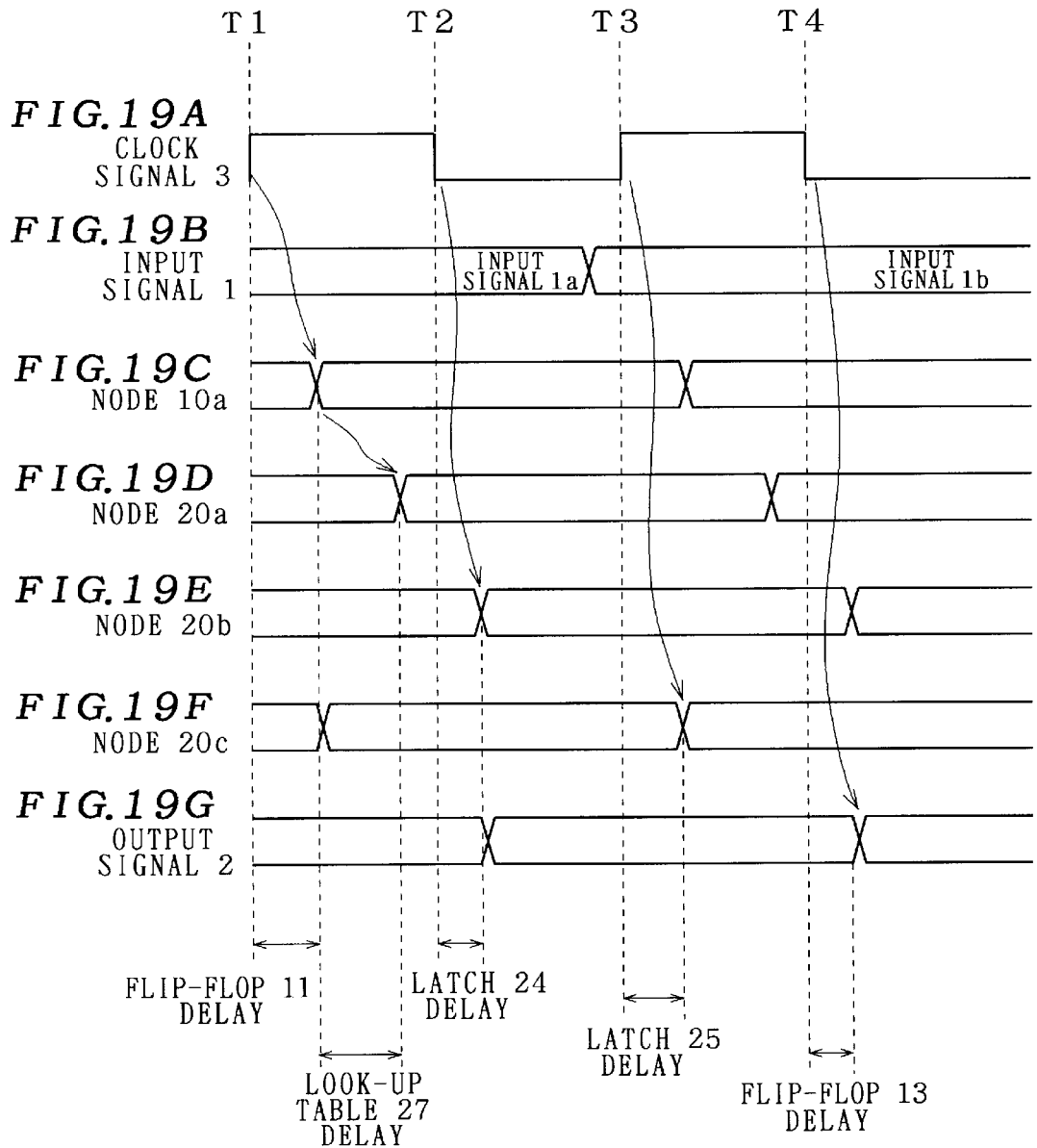
FIGS. 19A–19G is a timing chart of a signal in the semiconductor integrated circuit shown in FIG. 17.

The flow of signals will be described below with reference to a timing chart of FIG. 19. At a time T1, when the clock signal 3 is set to the "H" level, all the nodes of the logic 14 are set to the "L" level. A flip-flop 11 fetches an input signal 1 to be output to the node 10a. The signal of the node 10a is a current input. The current input is sent to the look-up table 27 provided in a control portion 20.

Then, the look-up table 27 inputs the current input as a low address, and outputs bits having the "L" or "H" level to the node 20a. The signal of the node 20a is sent to a latch 24 and the flip-flop 11 provided in a clock synchronous system 10.

The flip-flop 11 does not invert the input signal 1 if the signal of the node 20a has the "L" level. The flip-flop 11 inverts the input signal 1 if the signal of the node 20a has the "H" level. The latch 24 is non-conductive while the clock signal 3 has the "H" level. Consequently, a node 20b is not changed.

At a time T2, when the clock signal 3 is set to the "L" level, the same processing as in the first embodiment is performed. When the clock signal 3 is set to the "L" level, the logic 14 can perform the processing such as operation.

At a time T3, when the clock signal 3 is set to the "H" level, the same processing as in the first embodiment is performed. Furthermore, all the nodes of the logic 14 are set to the "L" level.

At a time T4, when the clock signal 3 is set to the "L" level, the same processing as in the first embodiment is performed. Furthermore, the logic 14 can perform the processing such as operation.

In the logic 14 having the predischarge method described above, it is decided whether the input signal is inverted by using the look-up table 27 or not so that the consumed power can be reduced. As described above, a portion for implementing the function of inverting the signals of the control portion 20, the flip-flop 11 and a flip-flop 13 has overhead so that the consumed power is increased more than in an ordinary system. If the amount of the consumed power which is reduced by inverting the input is bigger than that of the consumed power which is increased by the overhead, the consumed power can be reduced as a whole.

Fifth Embodiment

Figure 20:
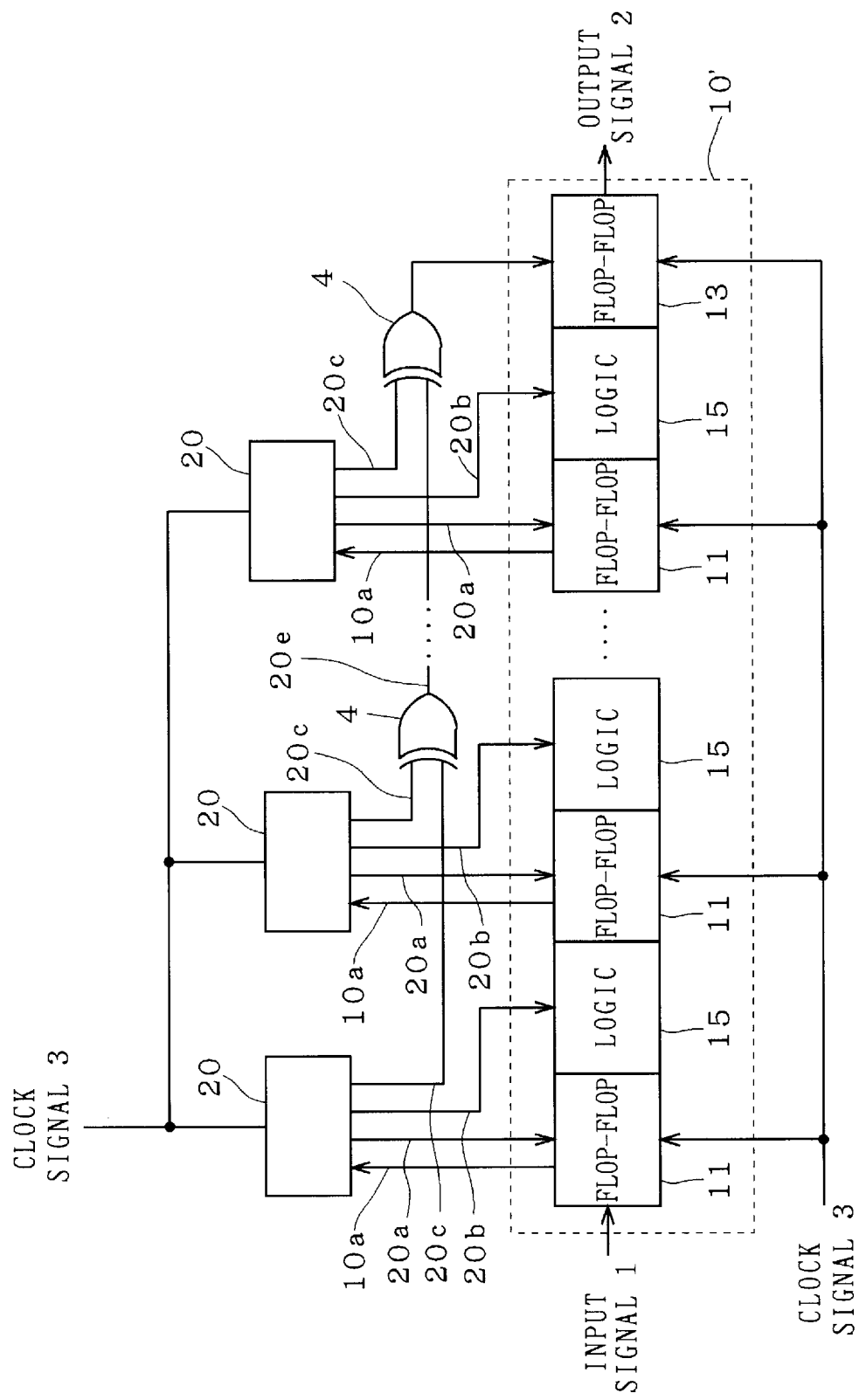
FIG. 20 is a block diagram showing main parts of the structure of a semiconductor integrated circuit according to a fifth embodiment of the present invention.

The present embodiment has a structure in which a plurality of structures according to the first to fourth embodiments are arranged. FIG. 20 is a block diagram showing main parts of the structure of a semiconductor integrated circuit according to a fifth embodiment of the present invention. In FIG. 20, each logic 15 is the logic 12 or 14. Each control portion 20 corresponds to any of the control portions 20 described in the first to fourth embodiments. If the logic 15 is the logic 14, the control portion 20 according to the third or fourth embodiment is used for the control portion 20 connected to a node 20b of the logic 14. A clock synchronous system 10' includes a flip-flop 11, the logic 15, the flip-flop 11, the logic 15, . . . , the flip-flop 11, the logic 15, and a flip-flop 13.

An exclusive OR circuit 4 receives a node 20c of the control portion 20 on a second stage and that of the control portion 20 on a first stage. The exclusive OR circuit 4 which receives the nodes 20c of the control portions 20 on and after a third stage also receives an output node 20e of the exclusive OR circuit 4 which has received the node 20c of the control portion 20 on a last stage. The output node 20e of the exclusive OR circuit 4 which has received the node 20c of the control portion 20 on a final stage is connected to a node 11h of the flip-flop 13 on the final stage. Thus, the exclusive OR circuit 4 is connected so that the information that the result of the processing of the logic 15 is inverted or not can be transmitted to the subsequent stages.

More specifically, the foregoing will be described below with reference to FIG. 21. The node 20c of the control portion 20 on the first stage represents that the result of the processing obtained by the logic 15 on the first stage is inverted or not. The node 20c of the control portion 20 on the second stage represents that the result of the processing obtained by the logic 15 on the second stage is inverted or not. The exclusive OR of the signals of the nodes 20c of the control portions 20 on the first and second stages is obtained to indicate the results of the processing which have passed through the logics 15 on the first and second stages. In other words, if both of the signals of the nodes 20c of the control portions 20 on the first and second stages have the "L" level, the result of the processing is not inverted. Consequently, a signal having the "L" level is sent to the output node 20e in order to transmit, to the control portion 20 on the third stage, that the result of the processing is not inverted. If either of the signals of the nodes 20c of the control portions 20 on the first and second stages has the "H" level, the result of the processing is inverted. Consequently, a signal having the "H" level is sent to the output node 20e in order to transmit, to the control portion 20 on the third stage, that the result of the processing is inverted. If both of the signals of the nodes 20c of the control portions 20 on the first and second stages have the "H" level, the result of the processing is inverted twice so that it is not inverted. Consequently, the signal having the "L" level is sent to the output node 20e in order to transmit, to the control portion 20 on the third stage, that the result of the processing is not inverted.

As described above, the control portion 20 and the logic 12 or 14 according to any of the first to fourth embodiments are arranged in a plurality of stages so that the consumed power can be reduced. Thus, a portion for implementing the function of inverting the signals of the control portion 20, the flip-flop 11 and the flip-flop 13 has overhead so that the consumed power is increased more than in an ordinary system. If the amount of the consumed power which is reduced by inverting the input is bigger than that of the consumed power which is increased by the overhead, the consumed power can be reduced as a whole.

Sixth Embodiment

Figure 22:
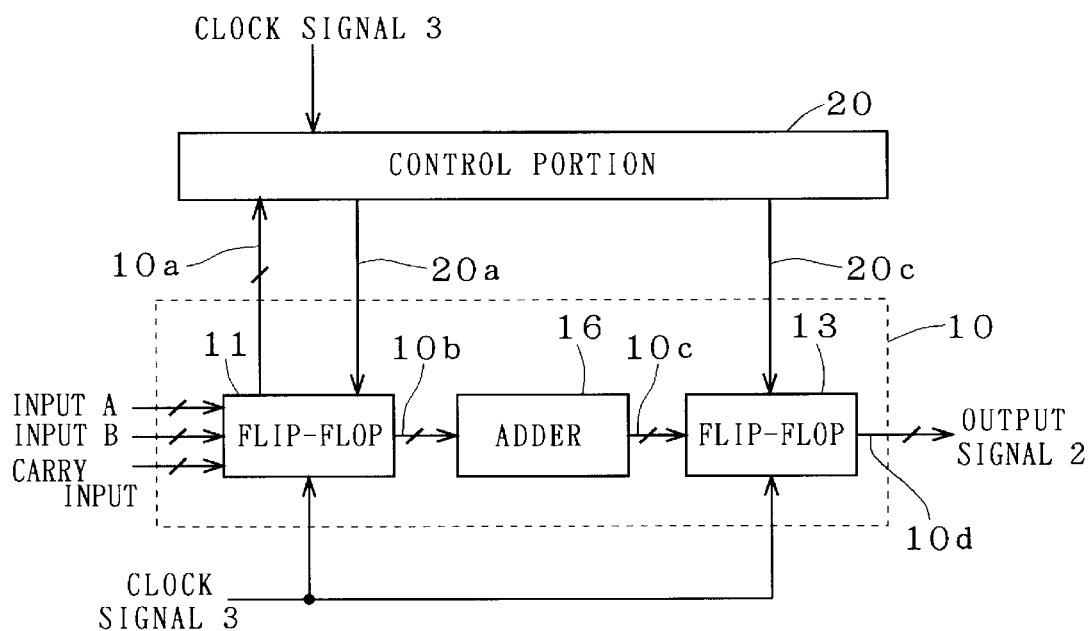
FIG. 22 is a block diagram showing main parts of the structure of a semiconductor integrated circuit including an adder according to a sixth embodiment of the present invention.

A specific example of the logic 12 according to the first and second embodiments will be described below by using an adder. FIG. 22 is a block diagram showing main parts of the structure of a semiconductor integrated circuit comprising the adder according to a sixth embodiment of the present invention. The structure of the semiconductor integrated circuit shown in FIG. 22 is mainly the same as that of FIG. 1 or 12. The logic 12 shown in FIG. 1 or 12 is replaced with an adder 16. An input including an input A, an input B and a carry input corresponds to the input signal 1.

FIGS. 23(a) and 23(b) show a general expression and an example of calculation of the adder 16, respectively. The adder 16 adds the input A, the input B and the 1-bit carry input. As shown by the general expression, a value obtained by adding the input A, the input B and the carry input is equal to a value obtained by inverting a value which is obtained by adding the inverted input A, input B and carry input. In other words, the adder 16 does not need any portion which corresponds to the circuit 12a for inversion.

The example of calculation will be described below. In the case where the input A has a value of "11100", the input B has a value of "00010" and the carry input has a value of "1", and signals of nodes 20a and 20c have the "H" level, the input A, the input B and the carry input are inverted by a flip-flop 11. Consequently, the respective values are changed to "00011", "11101" and "0". The adder 16 adds the inverted values of the input A, input B and carry input. A value obtained by addition is "00000". The value obtained by the addition is inverted by a flip-flop 13. Consequently, an output signal 2 has a value of "11111". The value of the output signal 2, that is, "11111" is equal to a value obtained by adding the input A, input B and carry input as they are.

As described above, a portion for implementing the function of inverting the signals of the control portion 20, the flip-flop 11 and the flip-flop 13 has overhead so that the consumed power is increased more than in an ordinary system. If the amount of the consumed power which is reduced by inverting the input is bigger than that of the consumed power which is increased by the overhead, the consumed power can be reduced as a whole. Furthermore, the adder 16 does not need any portion which corresponds to the circuit 12a for inversion. Consequently, the circuit area of the adder 16 obtained in the case where the control portion 20 is applied is equal to that of the adder 16 obtained in the case where the control portion 20 is not applied. Thus, an increase in the circuit area of the whole semiconductor integrated circuit which is caused by applying the control portion 20 can be controlled to a minimum.

An adder 16 having a predischarge method may be applied to the logic 14 according to the third and fourth embodiments.

Seventh Embodiment

Figure 24:
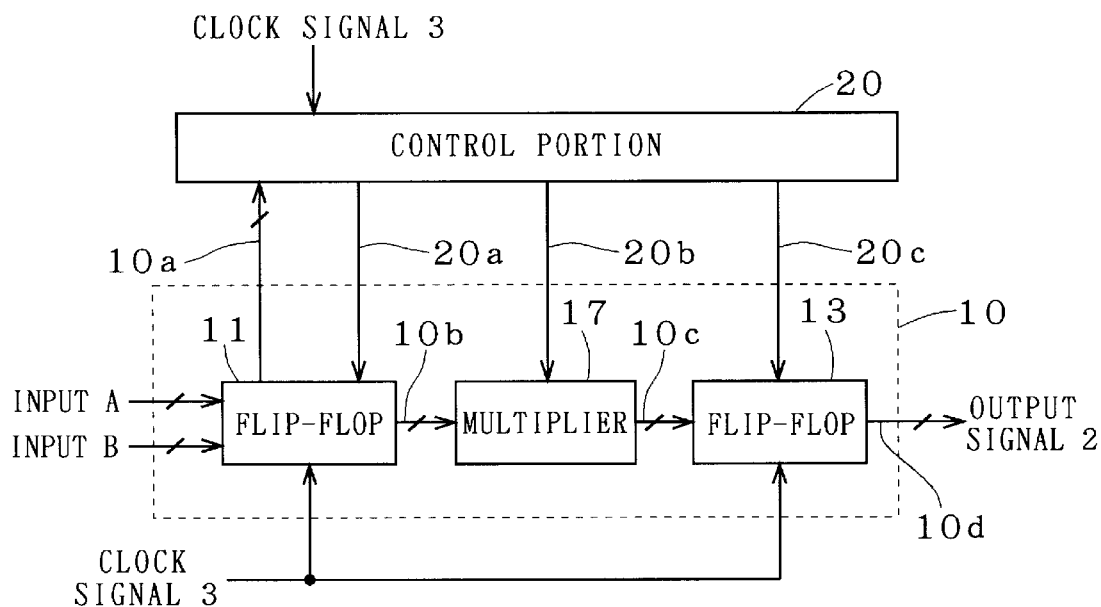
FIG. 24 is a block diagram showing main parts of the structure of a semiconductor integrated circuit including a multiplier according to a seventh embodiment of the present invention.

A specific example of the logic 12 according to the first and second embodiments will be described below by using a multiplier. FIG. 24 is a block diagram showing main parts of the structure of a semiconductor integrated circuit comprising the multiplier according to a seventh embodiment of the present invention. The structure of the semiconductor integrated circuit shown in FIG. 24 is mainly the same as that of FIG. 1 or 12. The logic 12 shown in FIG. 1 or 12 is replaced with a multiplier 17. An input including an input A and an input B corresponds to the input signal 1.

Figure 25:
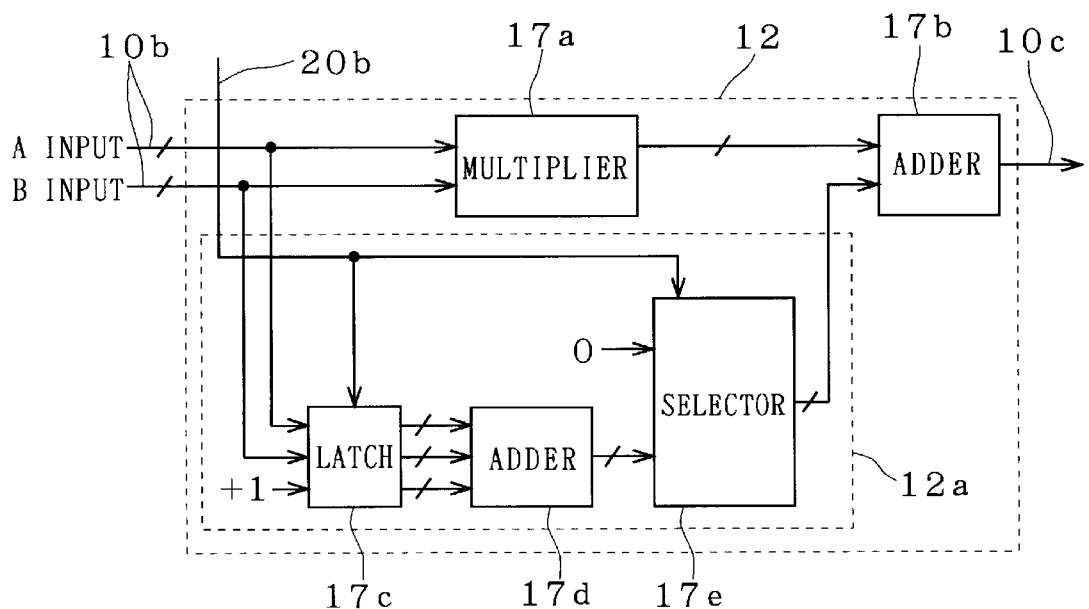
FIG. 25 is a diagram showing the structure of a multiplier 17.

FIG. 25 is a diagram showing the structure of the multiplier 17. A circuit 12a for inversion has a latch 17c, an adder 17d and a selector 17e. The multiplier 17 includes the circuit 12a for inversion, a multiplier 17a and an adder 17b. FIG. 26 is a diagram showing the structure of the selector 17e.

FIGS. 27(a) and 27(b) show a general expression and an example of calculation of the multiplier 17, respectively. The multiplier 17 multiplies an input A and an input B together. As shown by the general expression, a value obtained by multiplying the inputs A and B together is equal to a value obtained by adding a value which is obtained by multiplying the inverted input A, input B and carry input together, a value which is obtained by inverting the input A, a value obtained by inverting the input B, and 1.

The example of calculation will be described below. By way of example, the input A has a value of "00001001" and the input B has a value of "11111011". It is supposed that the signals of nodes 20a and 20b have the "L" level. A flip-flop 11 does not invert the inputs A and B but outputs them to the multiplier 17. The multiplier 17a multiplies the inputs A and B which are not inverted, and outputs the result of multiplication to the adder 17b. The latch 17c becomes nonconductive so that a gate provided in the adder 17d does not operate. The selector 17e selects 0 to be output to the adder 17b. The adder 17b adds a value output from the multiplier 17a and 0, and outputs the result of addition to a node 10c. The signal of the node 10c has a value of "111010011".

It is supposed that the signals of the nodes 20a and 20b have the "H" level. The flip-flop 11 inverts the inputs A and B. The input A has a value of "11110110", and the input B has a value of "00000100". The multiplier 17a multiplies the inverted input A and the inverted input B together, and outputs the result of multiplication to the adder 17b. A value output from the multiplier 17a is "1111011000". The latch 17c becomes conductive so that the adder 17d adds the inverted input A, the inverted input B and 1 and outputs the result of addition to the selector 17e. The selector 17e selects a value obtained by the addition to be output to the adder 17b. The adder 17b adds values output from the multiplier 17a and the selector 17e, and outputs the result of addition to the node 10c. The signal of the node 10c has a value of "111010011".

As described above, a portion for implementing the function of inverting the signals of the control portion 20, the flip-flop 11 and the flip-flop 13 has overhead so that the consumed power is increased more than in an ordinary system. If the amount of the consumed power which is reduced by inverting the input is bigger than that of the consumed power which is increased by the overhead, the consumed power can be reduced as a whole.

A multiplier 17 having a predischarge method may be applied to the logic 14 according to the third and fourth embodiments.

Eighth Embodiment

Figure 28:
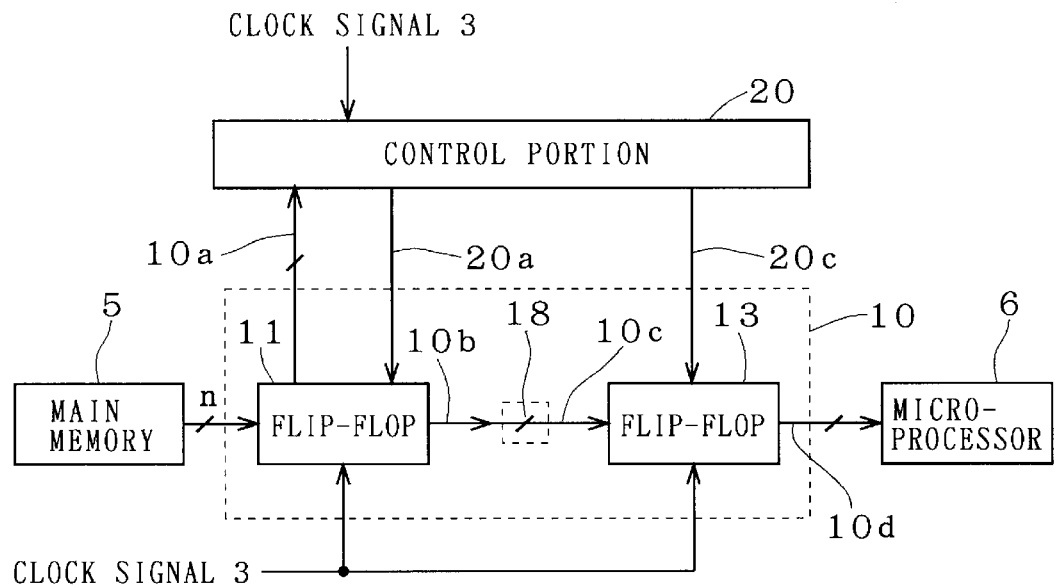
FIG. 28 is a block diagram showing main parts of the structure of a semiconductor integrated circuit including a bus 18 according to an eighth embodiment of the present invention.

A specific example in which the logic 12 according to the first and second embodiments is applied to a bus between a main memory and a microprocessor will be described below. FIG. 28 is a block diagram showing main parts of the structure of a semiconductor integrated circuit including a bus 18 according to an eighth embodiment of the present invention.

If the signals of nodes 20a and 20c have the "H" level, a bus signal output from a main memory 5 to a flip-flop 11 is inverted and output to the bus 18. A flip-flop 13 receives the bus signal from the bus 18 and inverts the same bus signal again, and outputs the inverted bus signal to a microprocessor 6. If the signals of the nodes 20a and 20c have the "L" level, the bus signal output from the main memory 5 to the flip-flop 11 is not inverted but output to the bus 18 as it is. The flip-flop 13 receives the bus signal from the bus 18 and does not invert the same bus signal to be output to the microprocessor 6.

As described above, a portion for implementing the function of inverting the signals of a control portion 20, the flip-flop 11 and the flip-flop 13 has overhead so that the consumed power is increased more than in an ordinary system. If the amount of the consumed power which is reduced by inverting the input is bigger than that of the consumed power which is increased by the overhead, the consumed power can be reduced as a whole. Furthermore, the bus 18 does not need any portion which corresponds to the circuit 12a for inversion. Consequently, the circuit area of the bus 18 obtained in the case where the control portion 20 is applied is equal to that of the bus 18 obtained in the case where the control portion 20 is not applied. Thus, an increase in the circuit area of the whole semiconductor integrated circuit which is caused by applying the control portion 20 can be controlled to a minimum.

Ninth Embodiment

Figure 29:
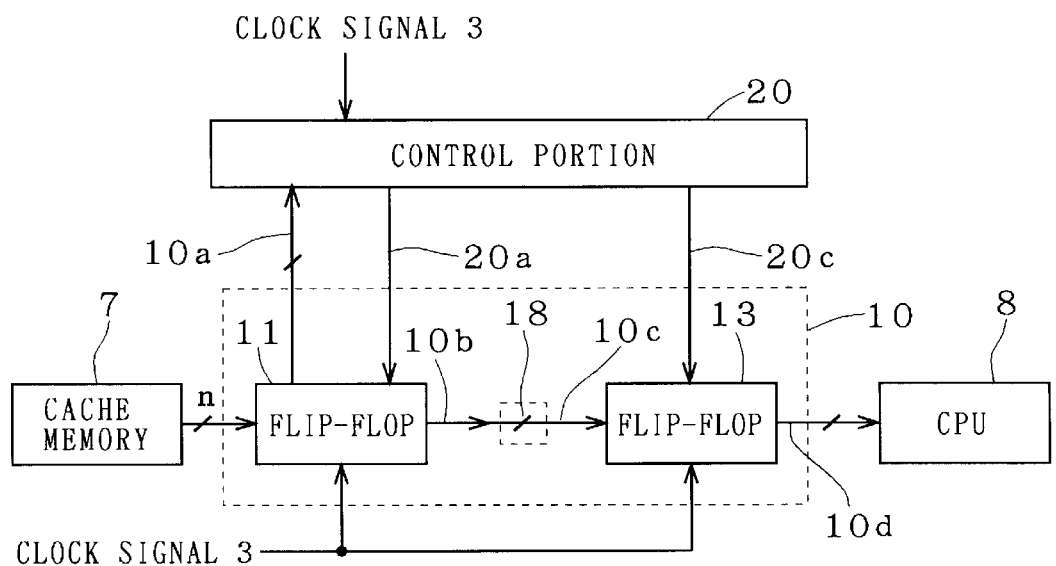
FIG. 29 is a block diagram showing main parts of the structure of a semiconductor integrated circuit including a bus 18 according to a ninth embodiment of the present invention.

A specific example in which the logic 12 according to the first and second embodiments is applied to a bus between a cache and a CPU will be described below. FIG. 29 is a block diagram showing main parts of the structure of a semiconductor integrated circuit including a bus 18 according to a ninth embodiment of the present invention.

If the signals of nodes 20a and 20c have the "H" level, a bus signal output from a cache 7 to a flip-flop 11 is inverted and output to the bus 18. A flip-flop 13 receives the bus signal from the bus 18 and inverts the same bus signal again, and outputs the inverted bus signal to a CPU 8. If the signals of the nodes 20a and 20c have the "L" level, the flip-flop 11 does not invert the bus signal but outputs the same bus signal to the bus 18 as it is. The flip-flop 13 receives the bus signal from the bus 18 and does not invert the same bus signal to be output to the CPU 8.

As described above, a portion for implementing the function of inverting the signals of a control portion 20, the flip-flop 11 and the flip-flop 13 has overhead so that the consumed power is increased more than in an ordinary system. If the amount of the consumed power which is reduced by inverting the input is bigger than that of the consumed power which is increased by the overhead, the consumed power can be reduced as a whole. Furthermore, the bus 18 does not need any portion which corresponds to the circuit 12a for inversion. Consequently, the circuit area of the bus 18 obtained in the case where the control portion 20 is applied is equal to that of the bus 18 obtained in the case where the control portion 20 is not applied. Thus, an increase in the circuit area of the whole semiconductor integrated circuit which is caused by applying the control portion 20 can be controlled to a minimum.

While the invention has been described in detail, the foregoing description is in all aspects illustrative and not restrictive. It is understood that numerous other modifications and variations can be devised without departing from the scope of the invention.

We claim:

1. A semiconductor integrated circuit comprising:

an inverting portion having a first input for receiving a sequence of a first input signal including a first plurality of bits and a second input signal including a second plurality of bits, a second input for receiving an inversion deciding signal, and an output for outputting said first input signal when said inversion deciding signal is in a first state and outputting an inverted signal of said first input signal when said inversion deciding signal is in a second state, said inverting portion inverting each bit of said first input signal to generate said inverted signal;

a logic portion coupled to said output of said inverting portion to generate an output signal;

a storing portion coupled to said inverting portion, for storing the second input signal including the second plurality of bits received at said first input of said inverting portion, said inverting portion receiving said first input signal subsequent to said second input signal at said first input; and an inversion deciding portion coupled to said storing portion to receive said second input signal and coupled to said inverting portion to receive said first input signal, and for generating said inversion deciding signal in accordance with respective bit values of said first and second input signals.

2. The semiconductor integrated circuit as defined in claim 1, wherein said inversion deciding portion includes a comparator for comparing said bits of said first input signal with said bits of said second input signal to output a result of comparison, and a counter receiving said result of comparison, for counting a number of bits having the same level between said first and second input signals to generate said inversion deciding signal.

3. The semiconductor integrated circuit as defined in claim 1, wherein said inversion deciding portion includes a look-up table for storing a plurality of bit values to output one of said bit values corresponding to said first and second input signals as said inversion deciding signal.

4. The semiconductor integrated circuit as defined in claim 1, further comprising another inverting portion receiving said output signal of said logic portion and receiving said inversion deciding signal for inverting each bit of said output signal in response to said inversion deciding signal and outputting the inverted bits.

5. The semiconductor integrated circuit as defined in claim 4, wherein said logic portion is an adder.

6. The semiconductor integrated circuit as defined in claim 1, wherein said logic portion further receives said inversion deciding signal and includes a logic circuit for inversion which is used only when said inverting portion inverts said first input signal.

7. The semiconductor integrated circuit as defined in claim 6, wherein said logic portion is a multiplier.

8. The semiconductor integrated circuit as defined in claim 4, further comprising a memory for outputting said first input signal and a microprocessor for receiving the output of said another inverting portion, said logic portion being a bus between said memory and said microprocessor.

9. The semiconductor integrated circuit as defined in claim 4, further comprising a cache memory for outputting said first input signal and a CPU for receiving the output of said another inverting portion, said logic portion being a bus between said cache memory and said CPU.

10. A semiconductor integrated circuit comprising:

an inverting portion having a first input for receiving an input signal including a plurality of bits, a second input for receiving an inversion deciding signal, and an output for outputting said input signal when said inversion deciding signal is in a first state and outputting an inverted signal of said input signal when said inversion deciding signal is in a second state, said inverting portion inverting each bit of said input signal to generate said inverted signal;

a logic circuit having internal nodes which are precharged to a constant level, and coupled to said output of said inverting portion to generate an output signal; and an inversion deciding portion coupled to said inverting portion and receiving said input signal, for generating said inversion deciding signal in accordance with bit values of said input signal.

11. The semiconductor integrated circuit as defined in claim 10, wherein said inversion deciding portion includes a counter receiving said input signal for counting a number of bits having a predetermined level to generate said inversion deciding signal.

12. The semiconductor integrated as defined in claim 10, wherein said inversion deciding portion includes a look-up table for storing a plurality of bit values to output one of said bit values corresponding to said input signal as said inversion deciding signal.

13. The semiconductor integrated circuit as defined in claim 10, further comprising another inverting portion receiving said output signal of said logic circuit and receiving said inversion deciding signal, for inverting each bit of said output signal in response to said inversion deciding signal and outputting the inverted bits.

14. The semiconductor integrated circuit as defined in claim 13, wherein said logic circuit is an adder.

15. The semiconductor integrated circuit as defined in claim 10, wherein said logic circuit further receives said inversion deciding signal and includes a logic circuit part for inversion which is used only when said inverting portion inverts said input signal.

16. The semiconductor integrated circuit as defined in claim 15, wherein said logic circuit is a multiplier.

17. A semiconductor integrated circuit receiving an input signal and comprising at least a first circuit portion and a second circuit portion connected in series, each circuit portion receiving a first signal and a second signal and outputting an output signal, said first circuit portion comprising:

an inverting portion having a first input for receiving a sequence of said first signal including a first plurality of bits and said second signal including a second plurality of bits, a second input for receiving an inversion deciding signal, and an output for outputting said first signal when said inversion deciding signal is in a first state and outputting an inverted signal of said first signal when said inversion deciding signal is in a second state, said inverting portion inverting each bit of said first signal to generate said inverted signal;

a logic portion coupled to said output of said inverting portion to generate said output signal;

a storing portion coupled to said inverting portion, for storing the second signal including the second plurality of bits received at said first input of said inverting portion, said inverting portion receiving said first signal subsequent to said second signal at said first input; and an inversion deciding portion coupled to said storing portion to receive said second input signal and coupled to said inverting portion to receive said first signal, and for generating said inversion deciding signal in accordance with respective bit values of said first and second signals; and said second circuit portion comprising:

an inverting portion having a first input for receiving a sequence of said first signal including a first plurality of bits and said second signal including a second plurality of bits, a second input for receiving an inversion deciding signal, and an output for outputting said first signal when said inversion deciding signal is in a first state and outputting an inverted signal of said first signal when said inversion deciding signal is in a second state, said inverting portion inverting each bit of said first signal to generate said inverted signal;

a logic portion having internal nodes which are precharged to a constant level, for receiving a signal from said output of said inverting portion to generate said output signal; and an inversion deciding portion coupled to said inverting portion and receiving said first signal, for generating said inversion deciding signal in accordance with bit values of said first signal;

wherein a first one of said plurality of circuits receives said input signal as said first signal and a remainder of said plurality of circuits each receives said output signal output from a preceding circuit as said first signal.

* * * * *